US009468066B2

(12) United States Patent
Park et al.

(10) Patent No.: US 9,468,066 B2
(45) Date of Patent: Oct. 11, 2016

(54) PHOTO SENSOR-INTEGRATED TUBULAR LIGHT EMITTING APPARATUS AND LIGHTING SYSTEM USING THE SAME

(71) Applicant: SAMSUNG ELECTRONICS CO., LTD., Suwon-si, Gyeonggi-do (KR)

(72) Inventors: Byoung-chul Park, Seoul (KR); Kyung-jin Jeon, Seoul (KR); Min-su Kim, Ansan-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 101 days.

(21) Appl. No.: 14/176,001

(22) Filed: Feb. 7, 2014

(65) Prior Publication Data
US 2014/0225513 A1 Aug. 14, 2014

(30) Foreign Application Priority Data

Feb. 8, 2013 (KR) .................. 10-2013-0014655

(51) Int. Cl.
| | |
|---|---|
| *H05B 33/08* | (2006.01) |
| *F21V 29/00* | (2015.01) |
| *F21K 99/00* | (2016.01) |
| *F21V 23/04* | (2006.01) |
| *F21Y 103/00* | (2016.01) |
| *F21Y 105/00* | (2016.01) |

(Continued)

(52) U.S. Cl.
CPC ....... *H05B 33/0848* (2013.01); *F21V 23/0464* (2013.01); *F21K 9/137* (2013.01); *F21K 9/17* (2013.01); *F21K 9/30* (2013.01); *F21V 23/0435* (2013.01); *F21V 29/004* (2013.01); *F21V 29/507* (2015.01); *F21Y 2101/02* (2013.01); *F21Y 2103/003* (2013.01); *F21Y 2105/001* (2013.01)

(58) Field of Classification Search
CPC ...... F21K 9/00; F21K 9/175; F21V 23/0464; F21V 23/0471; H05B 33/0803; H05B 37/0218; H05B 33/0854; F21Y 2101/02; F21Y 2103/003
USPC ............ 362/373, 294, 249.02, 800; 315/294, 315/291, 149–159, 185 R, 51
See application file for complete search history.

(56) References Cited

U.S. PATENT DOCUMENTS

| | | | |
|---|---|---|---|
| 6,583,573 B2 | 6/2003 | Bierman | |
| 6,762,562 B2 * | 7/2004 | Leong | ............................ 315/51 |

(Continued)

FOREIGN PATENT DOCUMENTS

| | | |
|---|---|---|
| JP | 2001-184936 A | 7/2001 |
| JP | 2008-181769 A | 8/2008 |

(Continued)

*Primary Examiner* — Haissa Philogene
(74) *Attorney, Agent, or Firm* — Muir Patent Law, PLLC

(57) ABSTRACT

A photo sensor-integrated tubular light emitting apparatus includes a cylindrical cover unit, a light-emitting module and a pair of sockets. The cylindrical cover unit includes a heat dissipation member and a cover. The cover has light-transmittance and is combined with the heat dissipation member. The light-emitting module is disposed in the cylindrical cover unit and has a plurality of arrayed light-emitting devices therein. The pair of sockets is combined with ends of the cylindrical cover unit. A photo sensor module is disposed in one of the pair of sockets. A driving voltage applied to the light-emitting module is adjusted based on an amount of light sensed by the photo sensor module.

17 Claims, 20 Drawing Sheets

(51) Int. Cl.
*F21V 29/507* (2015.01)
*F21Y 101/02* (2006.01)

(56) References Cited

U.S. PATENT DOCUMENTS

| | | | | |
|---|---|---|---|---|
| 7,178,941 | B2* | 2/2007 | Roberge | F21K 9/00 362/221 |
| 8,072,123 | B1* | 12/2011 | Han | 313/45 |
| 8,882,303 | B2* | 11/2014 | Totani | 362/294 |
| 8,896,208 | B2* | 11/2014 | Shew | H02J 9/065 315/166 |
| 8,956,013 | B1* | 2/2015 | Shew | 362/249.02 |
| 2010/0102730 | A1 | 4/2010 | Simon et al. | |
| 2014/0225517 | A1* | 8/2014 | Nam et al. | 315/185 R |
| 2014/0300274 | A1* | 10/2014 | Acatrinei | 315/85 |
| 2015/0022114 | A1* | 1/2015 | Kim | 315/294 |

FOREIGN PATENT DOCUMENTS

| | | |
|---|---|---|
| JP | 2011-076992 A | 4/2011 |
| KR | 10-2008-0041464 A | 5/2008 |
| KR | 10-0985474 B1 | 10/2010 |
| KR | 10-2011-0097548 A | 8/2011 |
| KR | 10-1095482 B1 | 12/2011 |

* cited by examiner

FIG. 11

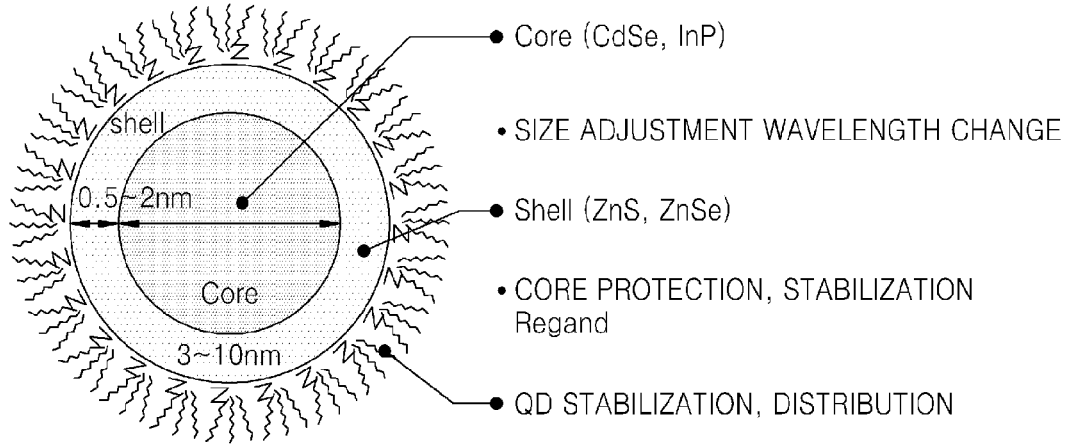

- Core (CdSe, InP)
- SIZE ADJUSTMENT WAVELENGTH CHANGE
- Shell (ZnS, ZnSe)
- CORE PROTECTION, STABILIZATION Regand
- QD STABILIZATION, DISTRIBUTION

FIG. 12

| APPLICATIONS | PHOSPHORS | |
|---|---|---|
| LED TV BLU | $\beta$-SiAlON:$Eu^{2+}$<br>(Ca,Sr)AlSiN$_3$:$Eu^{2+}$<br>$L_3Si_6O_{11}$:$Ce^{3+}$ | |
| LIGHTING | $Lu_3Al_5O_{12}$:$Ce^{3+}$<br>Ca-$\alpha$-SiAlON:$Eu^{2-}$<br>$L_3Si_6N_{11}$:$Ce^{3+}$<br>(Ca,Sr)AlSiN$_3$:$Eu^{2+}$<br>$Y_3Al_5O_{12}$:$Ce^{3+}$ | |
| Side view<br>(Mobile, Note PC) | $Lu_3Al_5O_{12}$:$Ce^{3+}$<br>Ca-$\alpha$-SiAlON:$Eu^{2-}$<br>$L_3Si_6N_{11}$:$Ce^{3+}$<br>(Ca,Sr)AlSiN$_3$:$Eu^{2+}$<br>$Y_3Al_5O_{12}$:$Ce^{3+}$<br>(Sr,Ba,Ca,Mg)$_2$SiO$_4$ | |
| ELECTRICAL EQUIPMENT<br>(Head Lamp etc.) | $Lu_3Al_5O_{12}$:$Ce^{3+}$<br>Ca-$\alpha$-SiAlON:$Eu^{2-}$<br>$L_3Si_6N_{11}$:$Ce^{3+}$<br>(Ca,Sr)AlSiN$_3$:$Eu^{2+}$<br>$Y_3Al_5O_{12}$:$Ce^{3+}$ | |

PHOTO SENSOR-INTEGRATED TUBULAR LIGHT EMITTING APPARATUS AND LIGHTING SYSTEM USING THE SAME

CROSS-REFERENCE TO RELATED APPLICATIONS

This application claims benefit of the priority of Korean Patent Application No. 10-2013-0014655, filed on Feb. 8, 2013, in the Korean Intellectual Property Office, the entire contents of which are hereby incorporated by reference.

TECHNICAL FIELD

The present inventive concept relates to a light emitting apparatus, and more particularly, to a photo sensor-integrated tubular light emitting apparatus using a light-emitting device and a lighting system using the photo sensor-integrated tubular light emitting apparatus.

BACKGROUND

Light emitting apparatuses such as an incandescent electric lamp, a fluorescent lamp, a three-wavelength bulb, or the like that are widely spread and used have problems due to their short lifetime and a low energy efficiency. In order to solve the problems, a light emitting apparatus and a lighting system that use a light-emitting diode (LED) was developed. Thus, there is a demand for research and development that allow general users to easily mount the light emitting apparatus using the LED or the lighting system using the LED.

SUMMARY

An aspect of the present inventive concept relates to a photo sensor-integrated tubular light emitting apparatus includes a cylindrical cover unit, a light-emitting module and a pair of sockets. The cylindrical cover unit includes a heat dissipation member and a cover. The cover has light-transmittance and is combined with the heat dissipation member. The light-emitting module is disposed in the cylindrical cover unit, and has a plurality of arrayed light-emitting devices therein. The pair of sockets is combined with ends of the cylindrical cover unit. A photo sensor module is disposed in one of the pair of sockets. A driving voltage applied to the light-emitting module is adjusted based on an amount of light sensed by the photo sensor module.

An electrode terminal may be disposed at one of the pair of sockets, a dummy terminal may be disposed at the other of the pair of sockets, and the electrode terminal may be electrically connected with the light-emitting module.

The one of the pair of sockets in which the photo sensor module is disposed may include a cap having a supporting unit to which a printed circuit board (PCB) of the photo sensor module is fixed, and a top cover combined with the cap or the PCB and having a through window to guide external light to be received by the photo sensor module.

A diameter of an input portion of the through window to which the external light is incident may be greater than a diameter of an output portion of the through window from which the external light is output.

A switch configured to selectively set on or off an automatic dimmer control may be additionally disposed on the PCB, and a through hole may be defined in the top cover so as to allow a button of the switch to be externally projected from the cap.

The photo sensor-integrated tubular light emitting apparatus may further include a cylindrical member surrounding the cap for light-reception adjustment, and a through hole may be defined in a partial region of the cylindrical member such that an amount of light passing through the through hole may be adjusted according to rotation of the cylindrical member.

The photo sensor module may include a photo sensor integrated circuit (IC) configured to convert an incident optical signal into an electrical signal.

The photo sensor module may further include a circuit configured to generate a dimmer control signal that corresponds to the electrical signal converted by the photo sensor IC.

A power supply unit (PSU) configured to generate a direct current (DC) power and the driving voltage may be mounted in the other of the pair of sockets, where the photo sensor module is not disposed, and the PSU and the photo sensor module may be electrically connected.

The cover may have an opening extending lengthwise at a side of the cover in a longitudinal direction.

The photo sensor-integrated tubular light emitting apparatus may include a loading unit onto which the PCB is disposed. The opening of the cover may be smaller than the loading unit such that a cover end that defines the opening of the cover interferes with the PCB disposed onto the loading unit.

Another aspect of the present inventive concept encompasses a lighting system including a tubular light emitting apparatus, a power supply unit (PSU) and a wiring structure. The tubular light emitting apparatus includes a cylindrical cover and a pair of sockets. A light-emitting module is disposed in the cylindrical cover. The pair of sockets are combined with ends of the cylindrical cover. A photo sensor module is disposed in one of the pair of sockets. The PSU is configured to convert an alternating current (AC) power into a direct current (DC) power, provide the DC power to the photo sensor module, and generate a driving voltage based on a signal supplied from the photo sensor module. The photo sensor module includes a photo sensor integrated circuit (IC) configured to convert an incident optical signal into an electrical signal. The wiring structure is configured to transfer the driving voltage to the light-emitting module via the one of the pair of sockets.

The lighting system may further include a connector electrically connecting the PSU and the light-emitting module. The DC power and the signal supplied from the photo sensor module may be transferred via the connector.

An electrode terminal may be disposed at the one of the pair of sockets, a dummy terminal may be disposed at the other of the pair of sockets, the electrode terminal may be electrically connected with the light-emitting module, and the light-emitting module may be disposed in the other one of the pair of sockets at which the dummy terminal is disposed.

The one of the pair of sockets in which the photo sensor module is disposed may include a cap having a supporting unit to which a printed circuit board (PCB) of the photo sensor module is fixed, and a top cover combined with the cap or the PCB and having a through window to guide external light to be received by the photo sensor module.

A switch configured to selectively set on or off an automatic dimmer control may be additionally disposed on the PCB, and a through hole may be defined in the top cover to allow a button of the switch to be externally projected from the cap.

The lighting system may further include a cylindrical member surrounding the cap for light-reception adjustment, and a through hole may be defined in a partial region of the cylindrical member such that an amount of light passing through the through hole may be adjusted according to rotation of the cylindrical member.

The cylindrical cover may have an opening extending lengthwise at a side of the cylindrical cover in a longitudinal direction.

The lighting system may include a loading unit onto which the PCB is disposed. The opening of the cylindrical cover may be smaller than the loading unit such that a cover end that defines the opening of the cylindrical cover interferes with the PCB disposed onto the loading unit.

BRIEF DESCRIPTION OF THE DRAWINGS

The foregoing and other features of the present inventive concept will be apparent from more particular description of embodiments of the present inventive concept, as illustrated in the accompanying drawings in which like reference characters may refer to the same or similar parts throughout the different views. The drawings are not necessarily to scale, emphasis instead being placed upon illustrating the principles of the embodiments of the present inventive concept.

FIG. 11 illustrates a structure of a quantum dot that may be used in an LED of a photo sensor-integrated tubular light emitting apparatus, according to an embodiment of the present inventive concept.

FIG. 12 illustrates phosphor types according to application fields of a white light-emitting device using a blue-light LED in a photo sensor-integrated tubular light emitting apparatus, according to an embodiment of the present inventive concept.

DETAILED DESCRIPTION

Figure 1A:
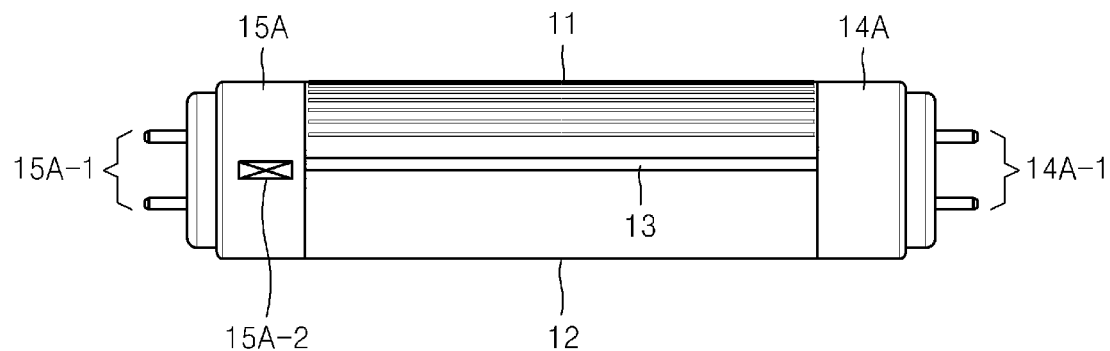
FIG. 1A is a conceptual diagram illustrating a photo sensor-integrated tubular light emitting apparatus, according to an embodiment of the present inventive concept.

The present inventive concept will now be described more fully with reference to the accompanying drawings, in which exemplary embodiments of the present inventive concept are shown. The present inventive concept may, however, be embodied in many different forms, and should not be construed as being limited to the embodiments set forth herein. Thus, the present inventive concept may include all revisions, equivalents, or substitutions which are included in the concept and the technical scope related to the present inventive concept. Like reference numerals in the drawings denote like elements. In the drawings, the dimension of structures may be exaggerated for clarity.

Furthermore, all examples and conditional language recited herein are to be construed as being without limitation to such specifically recited examples and conditions. Throughout the specification, a singular form may include plural forms, unless there is a particular description contrary thereto. Also, terms such as "comprise" or "comprising" are used to specify existence of a recited form, a number, a process, an operation, a component, and/or groups thereof, not excluding the existence of one or more other recited forms, one or more other numbers, one or more other processes, one or more other operations, one or more other components and/or groups thereof.

Unless expressly described otherwise, all terms including descriptive or technical terms which are used herein should be construed as having meanings that are obvious to one of ordinary skill in the art.

Also, terms that are defined in a general dictionary and that are used in the following description should be construed as having meanings that are equivalent to meanings used in the related description, and unless expressly described otherwise herein, the terms should not be construed as being ideal or excessively formal.

As used herein, the term "and/or" includes any and all combinations of one or more of the associated listed items.

Expressions such as "at least one of," when preceding a list of elements, modify the entire list of elements and do not modify the individual elements of the list.

FIG. 1A is a conceptual diagram illustrating a photo sensor-integrated tubular light emitting apparatus 10A according to an embodiment of the present inventive concept.

As illustrated in FIG. 1A, the photo sensor-integrated tubular light emitting apparatus 10A may include a heat dissipation member 11, a cover 12, a light-emitting module 13, and first and second sockets 14A and 15A.

The heat dissipation member 11 may be combined with the cover 12. The heat dissipation member 11 may include a material and a structure that efficiently dissipate heat generated in the light-emitting module 13.

The cover 12 may have a structure that is combined with the heat dissipation member 11. The cover 12 may include a transparent resin material for an optical use which may transmit light.

For example, the transparent resin material may selectively include a material such as polymethylmethacrylate (PMMA), polycarbonate (PC), cycloolefin polymer (COP), polyethylene terephthalate (PET), or acryl, or a material formed by coating a diffusion agent and/or a phosphor on an outer surface or an inner surface of one of the aforementioned materials. Also, the cover 12 may be formed by selectively using a transparent tube resin, a diffusion tube resin, a glass tube resin, or the like.

The heat dissipation member 11 and the cover 12 may be combined, thereby forming a cylindrical cover unit.

The light-emitting module 13 may be a module in which a plurality of light-emitting devices are arrayed. For example, the light-emitting module 13 may be disposed at a printed circuit board (PCB), and may be arranged as a light-emitting diode (LED) array based on a driving circuit.

The light-emitting module 13 may be fixed to a supporting unit that is formed in the heat dissipation member 11 or the cover 12.

The first and second sockets 14A and 15A may be a pair of sockets that are combined to ends of the cylindrical cover unit formed of the heat dissipation member 11 and the cover 12.

For example, an electrode terminal 14A-1 may be disposed at the first socket 14A, and a dummy terminal 15A-1 may be disposed at the second socket 15A. For example, the dummy terminal 15A-1 may be electrically open or short-circuited to a ground.

The electrode terminal 14A-1 that is disposed at the first socket 14A may be electrically connected with the light-emitting module 13. For example, a driving voltage that is applied from an external source to the light-emitting module 13 may be supplied to the electrode terminal 14A-1.

The second socket 15A at which the dummy terminal 15A-1 is disposed may include a photo sensor module 15A-2. For example, the second socket 15A may be formed to have a socket structure that is integrated with the photo sensor module 15A-2. The structure of the second socket 15A will be described in detail with reference to FIGS. 29 through 32.

The photo sensor module 15A-2 may include a sensor that senses an amount of ambient light. For example, the photo sensor module 15A-2 may include an integrated circuit formed of a photodiode and a peripheral circuit related to the photodiode. Alternatively, the photo sensor module 15A-2 may include various photo-sensing sensors other than the photodiode. For example, the photo sensor module 15A-2 may include a sensor that senses an amount of ambient light, and a calculation unit that calculates an ambient illumination level by using signals that are output from the sensor.

For example, the photo sensor module 15A-2 may include the sensor that senses an amount of ambient light, the calculation unit that calculates an ambient illumination level by using signals that are output from the sensor, and a control unit that generates a dimmer control signal corresponding to the ambient illumination level that is calculated by the calculation unit. The dimmer control signal may be a pulse width modulation (PWM) signal or a direct current (DC) voltage signal.

For example, the signals that are generated by the photo sensor module 15A-2 may be transmitted to an external source of the photo sensor-integrated tubular light emitting apparatus 10A via a connector. In another embodiment, the signals that are generated by the photo sensor module 15A-2 may be transmitted to an external source of the photo sensor-integrated tubular light emitting apparatus 10A via a wireless communication interface.

The photo sensor module 15A-2 may be embodied by disposing a photo sensor integrated circuit including a photodiode and various types of peripheral circuits onto the PCB.

Figure 1B:
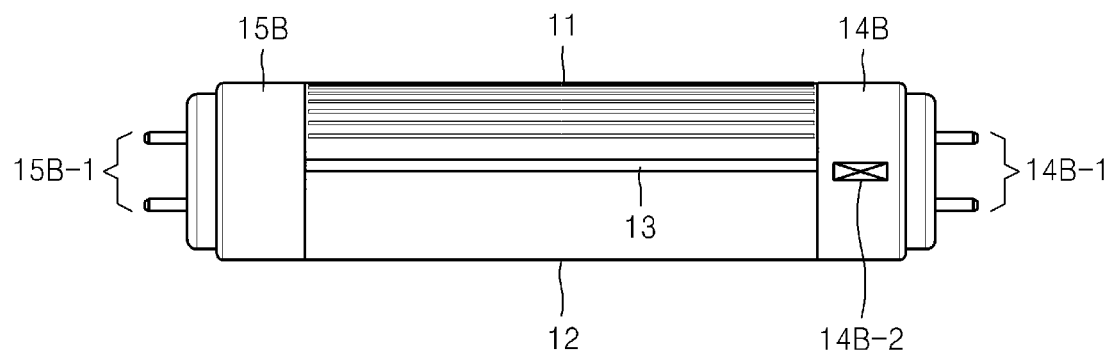
FIG. 1B is a conceptual diagram illustrating a photo sensor-integrated tubular light emitting apparatus, according to another embodiment of the present inventive concept.

FIG. 1B is a conceptual diagram illustrating a photo sensor-integrated tubular light emitting apparatus 10B, according to another embodiment of the present inventive concept.

As illustrated in FIG. 1B, the photo sensor-integrated tubular light emitting apparatus 10B may include the heat dissipation member 11, the cover 12, the light-emitting module 13, and first and second sockets 14B and 15B.

Since the heat dissipation member 11, the cover 12, and the light-emitting module 13 shown in FIG. 1B are the same elements as the heat dissipation member 11, the cover 12, and the light-emitting module 13 shown in FIG. 1A, detailed descriptions thereof are omitted here.

The first and second sockets 14B and 15B may be a pair of sockets that are combined to ends of a cylindrical cover unit formed of the heat dissipation member 11 and the cover 12.

For example, an electrode terminal 14B-1 may be disposed at the first socket 14B, and a dummy terminal 15B-1 may be disposed at the second socket 15B. For example, the dummy terminal 15B-1 may be electrically open or short-circuited to a ground.

The electrode terminal 14B-1 that is disposed at the first socket 14B may be electrically connected with the light-emitting module 13. For example, a driving voltage that is applied from an external source to the light-emitting module 13 may be supplied to the electrode terminal 14B-1.

The first socket 14B at which the electrode terminal 14B-1 is disposed may include a photo sensor module 14B-2. For example, the first socket 14B may be formed to have a socket structure that is integrated with the photo sensor module 14B-2. The structure of the first socket 14B will be described in detail with reference to FIGS. 29 through 32.

The photo sensor module 14B-2 may include a sensor that senses an amount of ambient light. For example, the photo sensor module 14B-2 may include an integrated circuit formed of a photodiode and a peripheral circuit related to the photodiode. Alternatively, the photo sensor module 14B-2 may include various photo-sensing sensors other than the photodiode. For example, the photo sensor module 14B-2 may include a sensor that senses an amount of ambient light, and a calculation unit that calculates an ambient illumination level by using signals that are output from the sensor.

For example, the photo sensor module 14B-2 may include the sensor that senses an amount of ambient light, the calculation unit that calculates an ambient illumination level by using signals that are output from the sensor, and a control unit that generates a dimmer control signal corresponding to the ambient illumination level that is calculated by the calculation unit. The dimmer control signal may be a pulse-width modulation (PWM) signal or a DC voltage signal.

For example, the signals that are generated by the photo sensor module 14B-2 may be transmitted to an external source of the photo sensor-integrated tubular light emitting apparatus 10B via a connector. In another embodiment, the signals that are generated by the photo sensor module 14B-2 may be transmitted to an external source of the photo sensor-integrated tubular light emitting apparatus 10B via a wireless communication interface.

The photo sensor module 14B-2 may be embodied by disposing a photo sensor integrated circuit including a photodiode and various types of peripheral circuits onto a PCB.

Figure 1C:
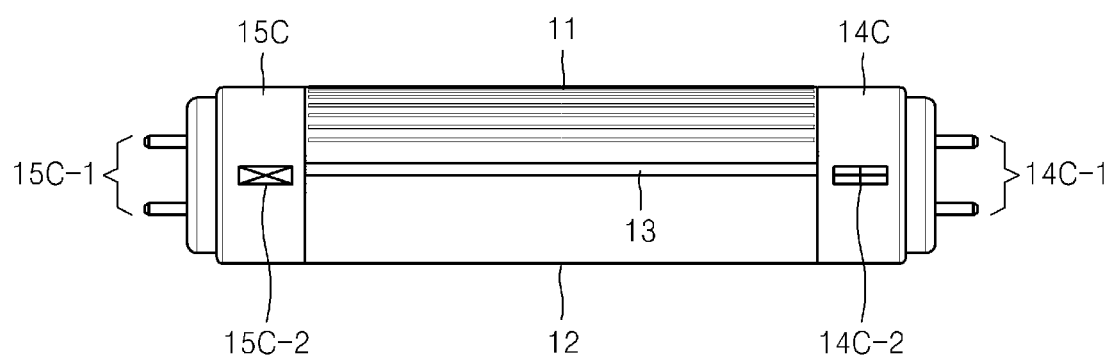
FIG. 1C is a conceptual diagram illustrating a photo sensor-integrated tubular light emitting apparatus, according to another embodiment of the present inventive concept.

FIG. 1C is a conceptual diagram illustrating a photo sensor-integrated tubular light emitting apparatus 10C, according to another embodiment of the present inventive concept.

As illustrated in FIG. 1C, the photo sensor-integrated tubular light emitting apparatus 10C includes the heat dissipation member 11, the cover 12, the light-emitting module 13, and first and second sockets 14C and 15C.

Since the heat dissipation member 11, the cover 12, and the light-emitting module 13 shown in FIG. 1C are the same elements as the heat dissipation member 11, the cover 12, and the light-emitting module 13 shown in FIG. 1A, detailed descriptions thereof are omitted here.

The first and second sockets 14C and 15C may be a pair of sockets that are combined to ends of a cylindrical cover unit formed of the heat dissipation member 11 and the cover 12.

For example, an electrode terminal 14C-1 may be disposed at the first socket 14C, and a dummy terminal 15C-1 may be disposed at the second socket 15C. For example, the dummy terminal 15C-1 may be electrically open or short-circuited to a ground.

The first socket 14C may include a power apparatus 14C-2. For example, the power apparatus 14C-2 may include a circuit that converts an alternating current (AC) power into a DC power and then provides the DC power to a photo sensor module 15C-2, and generates a driving voltage based on a signal supplied from the photo sensor module 15C-2.

The electrode terminal 14C-1 that is disposed at the first socket 14C may be electrically connected with the power apparatus 14C-2 that is included in the first socket 14C. Accordingly, an external power may be applied to the power apparatus 14C-2 via the electrode terminal 14C-1. The external power may be an AC power.

The power apparatus 14C-2 may be electrically connected with the light-emitting module 13. Accordingly, the driving voltage that is generated by the power apparatus 14C-2 may be applied to the light-emitting module 13.

The second socket 15C at which the dummy terminal 15C-1 is disposed may include a photo sensor module 15C-2. For example, the second socket 15C may be formed to have a socket structure that is integrated with the photo sensor module 15C-2. The structure of the second socket 15C will be described in detail with reference to FIGS. 29 through 32.

The photo sensor module 15C-2 may include a sensor that senses an amount of ambient light. For example, the photo sensor module 15C-2 may include an integrated circuit formed of a photodiode and a peripheral circuit related to the photodiode. Alternatively, the photo sensor module 15C-2 may include various photo-sensing sensors other than the photodiode. For example, the photo sensor module 15C-2 may include a sensor that senses an amount of ambient light, and a calculation unit that calculates an ambient illumination level by using signals that are output from the sensor.

For example, the photo sensor module 15C-2 may include the sensor that senses an amount of ambient light, the calculation unit that calculates an ambient illumination level by using signals that are output from the sensor, and a control unit that generates a dimmer control signal corresponding to the ambient illumination level that is calculated by the calculation unit. The dimmer control signal may be a PWM signal or a DC voltage signal.

The photo sensor module 15C-2 may be embodied by disposing a photo sensor integrated circuit including a photodiode and various types of peripheral circuits at a PCB.

The photo sensor module 15C-2 that is included in the second socket 15C may be electrically connected with the power apparatus 14C-2 included in the first socket 14C. For example, the signals that are generated by the photo sensor module 15C-2 may be transmitted to the power apparatus 14C-2 included in the first socket 14C via a connector. In another embodiment, the signals that are generated by the photo sensor module 15C-2 may be transmitted to the power apparatus 14C-2 included in the first socket 14C via a wireless communication interface.

Figure 2:
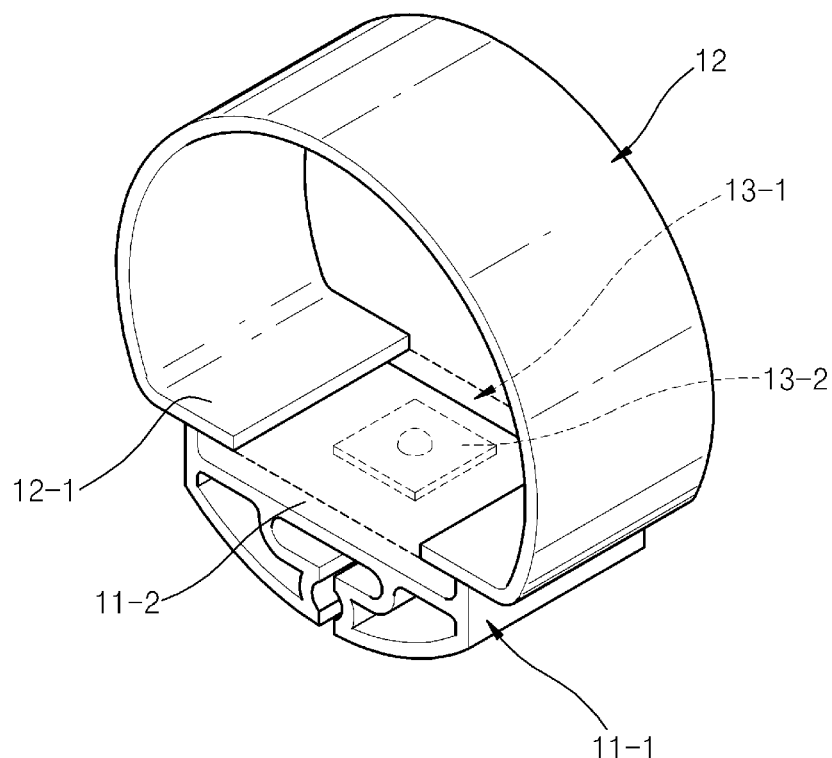
FIG. 2 illustrates a structure of a cylindrical cover unit of one of the photo sensor-integrated tubular light emitting apparatuses shown in FIGS. 1A, 1B, and 1C, according to an embodiment of the present inventive concept.

FIG. 2 illustrates a structure of the cylindrical cover unit of one of the photo sensor-integrated tubular light emitting apparatuses 10A, 10B, and 10C shown in FIGS. 1A, 1B, and 1C, according to an embodiment of the present inventive concept.

As illustrated in FIG. 2, the cylindrical cover unit may include a heat sink 11-1, a loading unit 11-2, and the cover 12. The heat dissipation member 11 may include the heat sink 11-1 and the loading unit 11-2. The light-emitting module 13 may include a PCB 13-1 and a light-emitting device 13-2. For example, the light-emitting device 13-2 may include an LED.

The cover 12 may be a member for transmitting light that is generated by the light-emitting device 13-2, and may surround the loading unit 11-2. The cover 12 may have a tubular shape. An opening may extend lengthwise at a side of the cover 12 in a longitudinal direction. That is, the cover 12 may be formed as the tubular shape having a 'C'-shape cross section. The heat sink 11-1 may be disposed at the opening of the cover 12. Here, the loading unit 11-2 of the heat sink 11-1 may be disposed at the opening of the cover 12.

Here, the opening of the cover 12 may be smaller than the loading unit 11-2. A cover end 12-1 that forms the opening of the cover 12 may interfere with the PCB 13-1 that is loaded onto the loading unit 11-2, so that the cover end 12-1 may prevent the PCB 13-1 from being undesirably unloaded from the loading unit 11-2. Thus, the PCB 13-1 may slide into the loading unit 11-2 via both open ends of the cover 12 and the heat sink 11-1.

Also, first and second sockets (not separately shown) may be mounted, respectively, at the both ends of the cover 12, which are open in a longitudinal direction of the cover 12.

The first and second sockets may prevent the PCB 13-1 from being undesirably unloaded from the loading unit 11-2 via the both ends of the cover 12 in the longitudinal direction. Thus, the PCB 13-1 may be housed in a sealed space that is made by the heat sink 11-1, the cover 12, and the first and second sockets.

In an embodiment of the present inventive concept, the cover 12 and the heat sink 11-1 may be integrally formed via an extruding method. That is, the cover 12 and the heat sink 11-1 may be formed of a material such as a heat dissipation resin that may be extruded, and when the cover 12 and the heat sink 11-1 are melted after being doubly extruded, the cover 12 and the heat sink 11-1 may be integrally bonded to each other.

The cover may be formed of a transparent or translucent extrudable material. That is, the cover 12 may be formed of a transparent material or a translucent material of which light transmittance is 50% so as to smoothly transmit light that is generated by the light-emitting device 13-2. For example, the cover 12 may be formed of a transparent or translucent plastic material such as polycarbonate or polycarbonate containing a diffuser.

The heat sink 11-1 may be formed of an extrudable material having a more excellent heat dissipation property than a material of the cover 12. That is, the heat sink 11-1 may be formed of a heat dissipation resin containing a high heat conductive filler so as to externally dissipate heat that is generated by the light-emitting device 13-2. For example, the heat sink 11-1 may be formed of a resin containing a filler capable of improving a thermal conductivity, e.g., polycarbonate containing a high heat conductive filler. Examples of the filler to improve a thermal conductivity may include a carbon filler, an alumina filler, a graphite filler, a ceramic filler, or the like.

As described above, when the cover 12 and the heat sink 11-1 are formed of different materials, the cover 12 and the heat sink 11-1 may differ in a thermal expansion rate, such that, when the cover 12 and the heat sink 11-1 are extruded, shapes of the cover 12 and the heat sink 11-1 may be undesirably deformed. Thus, at least one of the cover 12 and the heat sink 11-1 may further include a thermal expansion change material (not separately shown) that changes a thermal expansion coefficient, and by doing so, properties of the cover 12 and the heat sink 11-1 may be changed to have equal or similar thermal expansion coefficients. The thermal expansion change material may include an inorganic filler or glass fiber capable of changing the thermal expansion coefficient. For example, the inorganic filler may include titanium dioxide ($TiO_2$), barium sulphate ($BaSO_4$), or silicon dioxide ($SiO_2$).

The PCB 13-1 onto which the light-emitting device 13-2 is mounted may be formed of a material having excellent heat dissipation and light reflection. For example, the PCB 13-1 may be an FR4-type PCB, may be formed of an organic resin material including epoxy, triazines, silicon, or polyimide, or other organic resin materials, or may be formed of a ceramic material including silicon nitride, AlN, $Al_2O_3$, or the like. The PCB 13-1 may be formed of a material including metal and a metal compound, and may include a metal core PCB (MCPCB), or the like. The PCB 13-1 may be formed as a flexible PCB (FPCB) having flexibility so as to be deformed to match with a light diffusing unit (not separately shown) having a curved shape.

Figure 3:
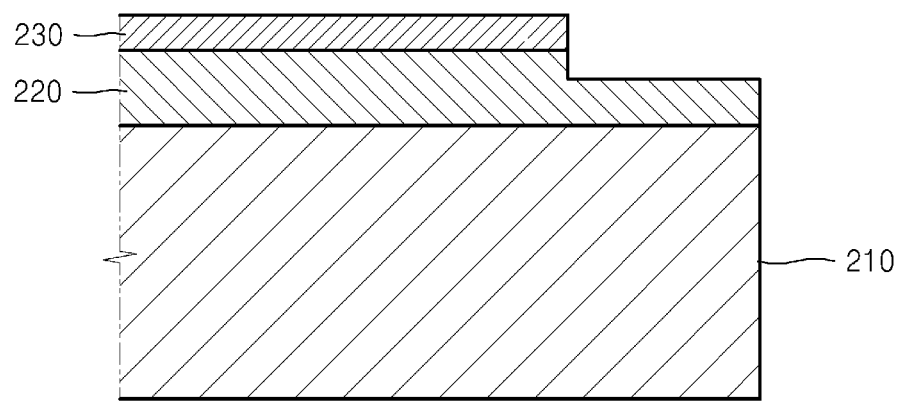
FIG. 3 is a cross-sectional view illustrating a structure of a circuit board of a light-emitting module included in a photo sensor-integrated tubular light emitting apparatus, according to an embodiment of the present inventive concept.

The PCB 13-1 may be formed as a metal substrate as shown in FIG. 3.

As illustrated in FIG. 3, the metal substrate may include an insulating layer 220 formed on a first metal layer 210, and a second metal layer 230 formed on the insulating layer 220. A stepped region to expose the insulating layer 220 may be formed at one side end of the metal substrate.

The first metal layer 210 may be formed of a material having an excellent heat dissipation property, and may have a single-layer structure or a multi-layer structure. The insulating layer 220 may be formed of an insulating material including an inorganic material or an organic material. For example, the insulating layer 220 may be formed of an epoxy-based insulating resin including a metal powder such as an Al powder so as to improve thermal conductivity. The second metal layer 230 may be formed of a Cu thin-film.

Figure 4:
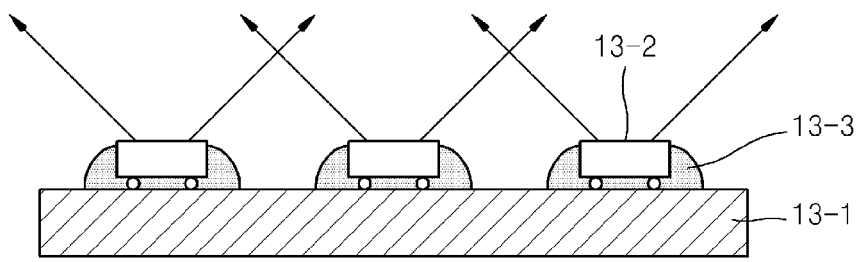
FIG. 4 is a cross-sectional view illustrating a structure of a circuit board of a light-emitting module included in a photo sensor-integrated tubular light emitting apparatus, according to another embodiment of the present inventive concept.

For example, as illustrated in FIG. 4, the PCB 13-1 may be a circuit board having a structure in which an LED chip is directly mounted on the PCB 13-1 or a package 13-2 having a chip is mounted on the PCB 13-1, and a waterproof agent 13-3 surrounds the package 13-2.

Figure 5:
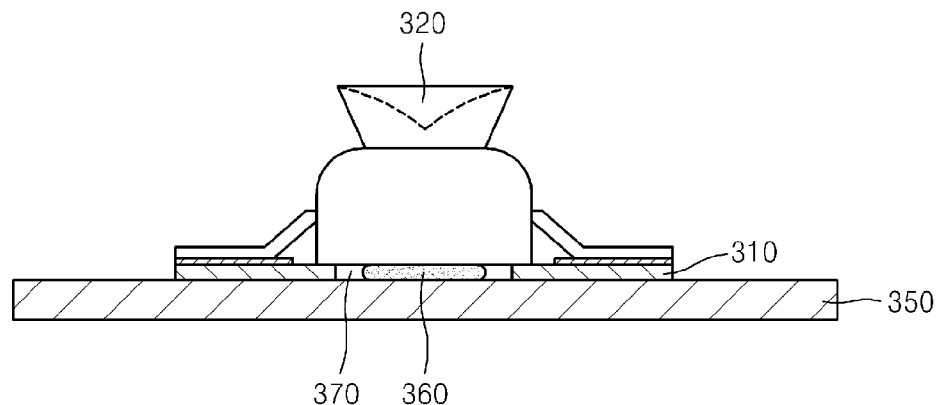
FIG. 5 is a cross-sectional view illustrating a structure of a circuit board of a light-emitting module included in a photo sensor-integrated tubular light emitting apparatus, according to another embodiment of the present inventive concept.

For example, the PCB 13-1 may include a flexible substrate as shown in FIG. 5.

As illustrated in FIG. 5, the flexible substrate may be provided as a slim-type substrate unit capable of decreasing a thickness and a weight of the photo sensor-integrated tubular light emitting apparatus 10A, reducing the manufacturing costs, and increasing a heat dissipation efficiency. The slim-type substrate unit may include a circuit board having one or more through holes formed therein, and LED chips or packages that are coupled to the circuit board via the one or more through holes, respectively. By using the flexible substrate as a substrate material of the slim-type substrate unit, the thickness and weight may be decreased so that slimness and light-weight may be achieved and the manufacturing costs may be reduced. Since the LED chip or the package is directly coupled to a supporting substrate by using a heat dissipation adhesive, dissipation efficiency of heat that is generated in the LED chip or the package may be improved.

Referring to FIG. 5, the flexible substrate may include a flexible PCB 310 in which at least one through hole 370 is formed, a LED chip or package 320 that is coupled onto the flexible PCB 310 via the at least one through hole 370, a supporting substrate 350 to which the flexible PCB 310 is mounted, and a heat dissipation adhesive 360 that is arranged in the at least one through hole 370 so as to couple a bottom surface of the LED chip or package 330 with a top surface of the supporting substrate 350. The bottom surface of the LED chip or package 320 may be a bottom surface of a chip package whose bottom surface of an LED chip is directly exposed, a bottom surface of a lead frame having a top surface to which a chip is mounted, or a metal block.

Figure 6:
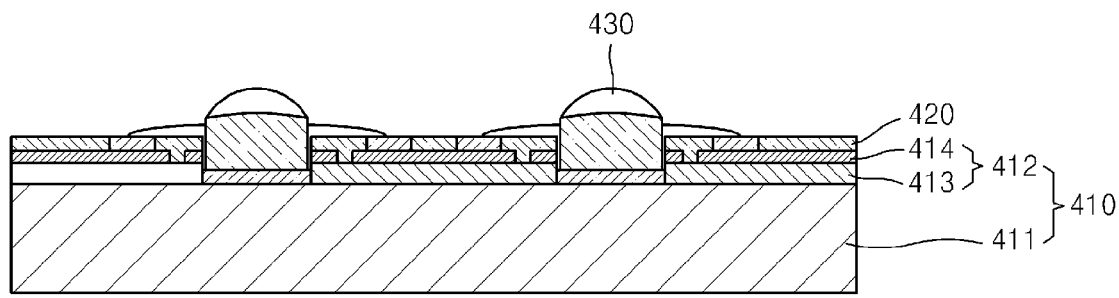
FIG. 6 is a cross-sectional view illustrating a structure of a circuit board of a light-emitting module included in a photo sensor-integrated tubular light emitting apparatus, according to another embodiment of the present inventive concept.

For example, the PCB 13-1 may include a substrate as shown in FIG. 6.

As illustrated in FIG. 6, a circuit board 410 may have a structure in which a resin coating copper clad laminate (RCC) 412 that is formed of an insulating layer 413 and a copper thin film layer that is stacked on the insulating layer 413 is stacked on a heat dissipation supporting substrate 411, and a protective layer 420 that is formed of a liquid photo solder resistor (PSR) is stacked on a circuit layer 414. A portion of the RCC 412 may be removed, so that a metal copper clad laminate (MCCL) having at least one groove to which an LED chip or package 430 is mounted is formed. In the circuit board 410, an insulating layer at a lower region of the LED chip or package 430 to which a light source is received may be removed, so that the light source contacts the heat dissipation supporting substrate 411, and heat that is generated in the light source is directly transferred to the heat dissipation supporting substrate 411, and thus a heat dissipation performance is improved.

Figure 7:
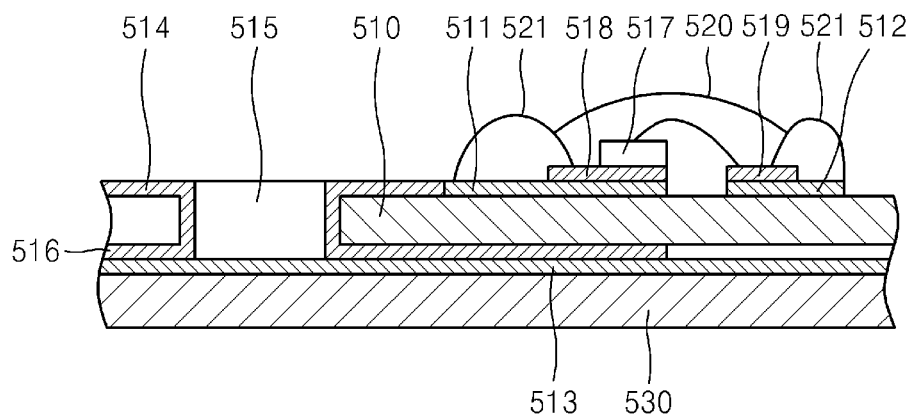
FIG. 7 is a cross-sectional view illustrating a structure of a circuit board of a light-emitting module included in a photo sensor-integrated tubular light emitting apparatus, according to another embodiment of the present inventive concept.

For example, the PCB 13-1 may include a circuit board 510 as shown in FIG. 7.

As illustrated in FIG. 7, the circuit board 510 may be an insulation substrate and have a structure in which circuit patterns 511 and 512 formed of a copper laminate are formed on a top surface of the insulation substrate. An insulation thin film layer 513 that is thinly coated with an insulation material may be formed on a bottom surface of the insulation substrate. Here, various coating methods such as a sputtering method or a spraying method may be used. Also, top and bottom heat diffusion plates 514 and 516 may be formed on the top and bottom surfaces of the circuit board 510 so as to dissipate heat that is generated in an LED module 500, and in particular, the top heat diffusion plate 514 directly contacts the circuit pattern 511. For example, the insulation material that is used as the insulation thin film layer 513 may have thermal conductivity that is significantly lower than that of a heat pad, but since the insulation thin film layer 513 has a very small thickness, the insulation thin film layer 513 may have a thermal resistance that is significantly lower than that of the heat pad. The heat that is generated in the LED module 500 may be transferred to the bottom heat diffusion plate 516 via the top heat diffusion plate 514 and then may be dissipated to a sash 530.

Two through holes 515 may be formed in the circuit board 510 and the top and bottom heat diffusion plates 514 and 516 so as to be vertical to the circuit board 510. The LED module 500 may include an LED chip 517, LED electrodes 518 and 519, a plastic molding case 521, a lens 520, or the like. The circuit board 510 may have a circuit pattern that is formed by laminating a copper layer onto an FR4-core that is a ceramic or epoxy resin-based material and then by performing an etching process.

The LED module 500 may have a structure in which at least one of a red-light LED that emits red light, a green-light LED that emits green light, and a blue-light LED that emits blue light is mounted, and at least one type of a phosphor material may be coated on a top surface of the blue-light LED.

The phosphor material may be sprayed while including a particle powder that is mixed with a resin. The phosphor powder may be fired and thus may be formed in the form of a ceramic plate layer on the top surface of the blue-light LED. A size of the phosphor powder may be from 1 µm to 50 µm, more preferably, from 5 µm to 20 µm. In a case of a nano phosphor, it may be a quantum dot having a size of from 1 to 500 nm, more preferably, from 10 nm to 50 nm.

Figure 8:
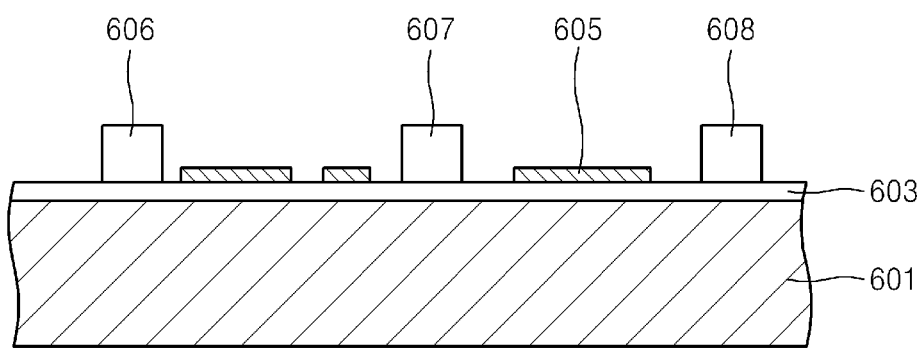
FIG. 8 is a cross-sectional view illustrating a structure of a circuit board of a light-emitting module included in a photo sensor-integrated tubular light emitting apparatus, according to another embodiment of the present inventive concept.

For example, the PCB 13-1 may include a metal substrate 600 as shown in FIG. 8.

As illustrated in FIG. 8, the metal substrate 600 may include a metal plate 601 that is formed of Al or an Al alloy, and an Al anodized layer 603 that is formed on a top surface of the metal plate 601. Heat generation devices 606, 607 and 608 such as LED chips may be mounted on the metal plate 601. The Al anodized layer 603 may insulate a wiring 605 from the metal plate 601.

The metal substrate 600 may be formed of Al or an Al alloy that is relatively less expensive. Alternatively, the metal substrate 600 may be formed of another material such as titanium or magnesium that may be anodized.

The Al anodized layer 603 that is obtained by anodizing Al may have a relatively high heat transfer characteristic of about 10 through 30 W/mK. Thus, the metal substrate 600 including the Al anodized layer 603 may have a heat dissipation characteristic that is more excellent that a heat dissipation characteristic of a polymer substrate-based PCB or an MCPCB according to the related art.

Figure 9:
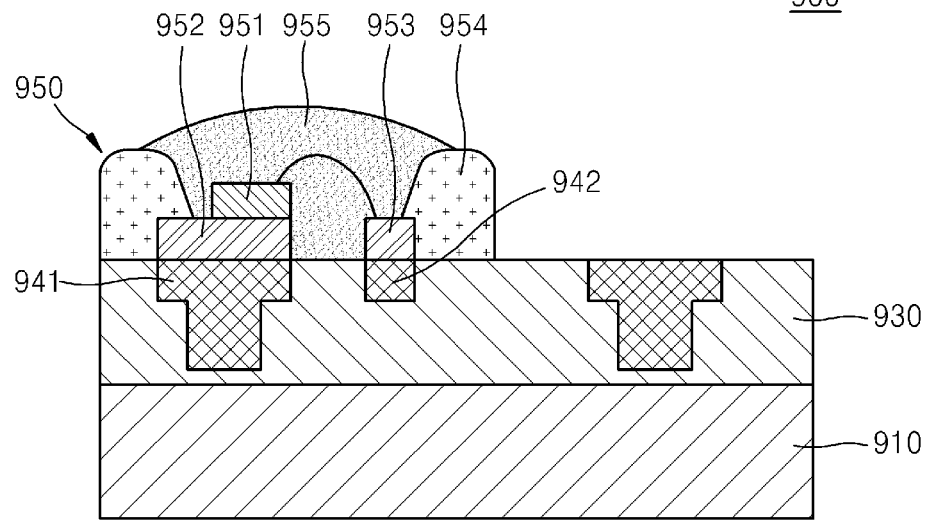
FIG. 9 is a cross-sectional view illustrating a structure of a metal sash to which the light-emitting module included in a photo sensor-integrated tubular light emitting apparatus is mounted, according to an embodiment of the present inventive concept.

For example, the PCB 13-1 may include a circuit board 900 as shown in FIG. 9.

As illustrated in FIG. 9, the circuit board 900 may include an insulation resin 930 that is coated on a metal substrate 910, circuit patterns 941 and 942 that are formed in the insulation resin 930, and an LED module 950 that is mounted to be electrically connected with the circuit patterns 941 and 942. Here, the insulation resin 930 may have a thickness that is equal to or less than 200 μm, and may be coated on a sash in the form of a solid-state film that is laminated on a metal substrate, or may be coated on the sash in a liquid state via a molding method using spin coating or a blade. Also, the circuit patterns 941 and 942 may be formed in a manner in which a metal material such as copper is filled in shapes of the circuit patterns 941 and 942 that are engraved in the insulation resin 930.

Referring to FIG. 9, the LED module 950 includes an LED chip 951, LED electrodes 952 and 953, a plastic molding case 954, and a lens 955.

In an embodiment of the present inventive concept, the light-emitting device may be a package product including an LED chip. However, in another embodiment, the light-emitting device may be an LED chip itself, and in this case, the LED chip that is a chip-on-board (COB) type may be mounted on the metal substrate 910 and then may directly achieve electrical connection with the metal substrate 910 via a flip chip bonding method or a wire bonding method.

A plurality of the light-emitting devices may be arrayed along the metal substrate 910. In this case, the plurality of the light-emitting devices may be homogeneous devices that generate light having the same wavelength. Alternatively, the plurality of the light-emitting devices may be heterogeneous devices that generate light having different wavelengths.

For example, the light-emitting devices may include at least one of a light-emitting device that is combination of a blue-light LED and a phosphor having a color of yellow, green, red, or orange and that emits white light, and a light-emitting device that emits a purple color, a blue color, a green color, a red color, or infrared light. In this case, a lighting apparatus may adjust a Color Rendering Index (CRI) of a solar level in sodium (Na) and also may generate a variety of white light from a candle temperature level (e.g., 1500K) to a blue sky temperature level (e.g., 12000K). When required, the lighting apparatus may adjust a lighting color according to the ambient atmosphere or mood by generating visible light having a color of purple, blue, green, red, or orange, or infrared light. Also, the lighting apparatus may generate light having a special wavelength capable of promoting a growth of plants.

Figure 10:
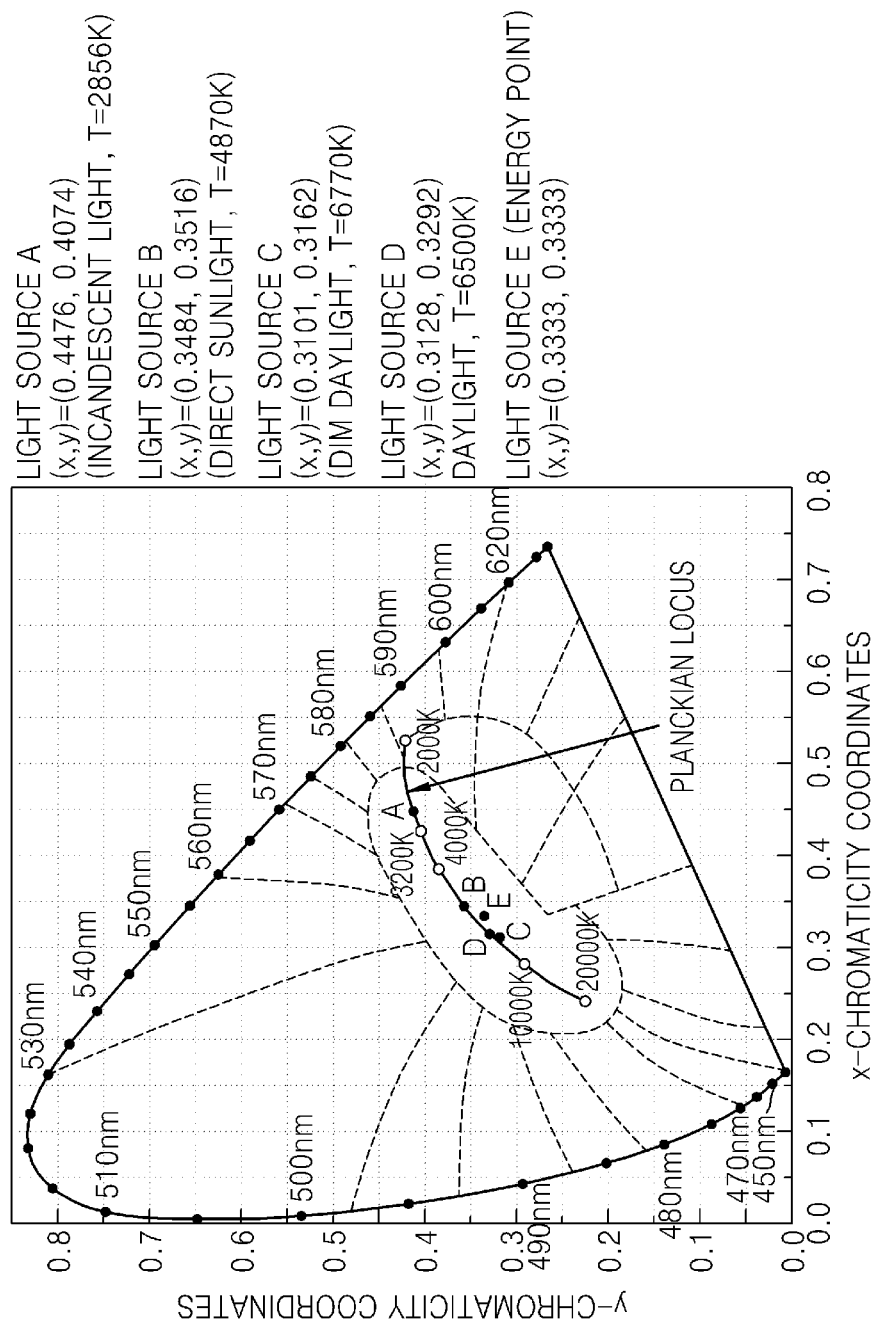
FIG. 10 illustrates a color temperature spectrum related to light that is emitted from a light-emitting diode (LED) of a photo sensor-integrated tubular light emitting apparatus, according to an embodiment of the present inventive concept.

White light that corresponds to a combination of the blue-light LED and the yellow, green, and red phosphors and/or green and red light-emitting devices may have at least two peak wavelengths and may be positioned at a line segment connecting (x, y) coordinates (0.4476, 0.4074), (0.3484, 0.3516), (0.3101, 0.3162), (0.3128, 0.3292), and (0.3333, 0.3333) of a CIE 1931 coordinate system. Alternatively, the white light may be positioned in a region that is surrounded by the line segment and a blackbody radiation spectrum. A color temperature of the white light may be between 2000k through 20000k. FIG. 10 illustrates a color temperature (i.e., a Planckian spectrum).

For example, phosphors that are used in an LED may have general formulas and colors as below.

oxide-based phosphors: yellow and green (Y, Lu, Se, La, Gd, Sm)3(Ga, Al)5O12:Ce, blue (Y, Lu, Se, La, Gd, Sm)3 (Ga, Al)5O12:Ce silicate-based phosphors: yellow and green (Ba, Sr)2SiO4:Eu, yellow and orange (Ba, Sr)3SiO5:Eu nitride-based phosphors: green β-SiAlON:Eu, yellow (La, Gd, Lu, Y, Sc)3Si6N11:Ce, orange α-SiAlON:Eu, red (Sr, Ca)AlSiN3:Eu, (Sr, Ca)AlSi(ON)3:Eu, (Sr, Ca)2Si5N8:Eu, (Sr, Ca)2Si5(ON)8:Eu, (Sr, Ba)SiAl4N7:Eu sulfide-based phosphors: red (Sr, Ca)S:Eu, (Y, Gd)2O2S: Eu, green SrGa2S4:Eu In general, the general formulas of the phosphors must match with the stoichiometry, and each element may be substituted for another element in the same group of the periodic table. For example, Sr may be substituted for Ba, Ca, Mg, or the like of the alkaline-earth elements group II, and Y may be substituted for Tb, Lu, Sc, Gd, or the like of lanthanide-base elements. Also, Eu that is an activator may be substituted for Ce, Tb, Pr, Er, Yb or the like according to a desired energy level, and the activator may be solely used or a sub-activator may be additionally used for a characteristic change.

As a substitute for the phosphors, materials such as a quantum dot or the like may be used. In this case, the LED, the phosphors, and the quantum dot may be combined or the LED and the quantum dot may be used.

The quantum dot may have a structure of a core (from 3 to 10 nm) such as CdSe, InP, or the like, a shell (from 0.5 to 2 nm) such as ZnS, ZnSe, or the like, and a Regand for stabilization of the core and the shell, and may realize various colors according to sizes. FIG. 11 illustrates an example of the structure of the quantum dot.

FIG. 12 illustrates phosphor types according to application fields of a white light-emitting device using a blue-light LED (from 440 to 460 nm).

Phosphors or quantum dots may be sprayed on an LED chip or a light-emitting device, may be used as a covering in the form of a thin-film, or may be attached in the form of a film-sheet or a ceramic phosphor sheet.

The phosphors or the quantum dots may be sprayed by using a dispensing method, a spray coating method, or the like, and in this regard, the dispensing method may include a pneumatic method and a mechanical method such as a screw, a linear type, or the like. A jetting method may allow a dotting amount control via a minute-amount discharge operation, and a color-coordinates control via the dotting amount control. A method of collectively spraying phosphors on a wafer level or a substrate of the light-emitting device may facilitate a control of productivity and a thickness of the light-emitting device.

The method of covering the phosphors or the quantum dots in the form of a thin-film on the light-emitting device or the LED chip may be performed by using an electrophoretic deposition method, a screen printing method, or a phosphor molding method, and one of the aforementioned methods may be used according to whether it is required to cover side surfaces of the LED chip.

In order to control an efficiency of a long-wavelength light-emitting phosphor that re-absorbs light that is emitted at a short-wavelength and that is from among at least two types of phosphors having different emission wavelengths, the at least two types of phosphors having different emission wavelengths may be distinguished, and in order to minimize wavelength re-absorption and interference of the LED chip and the at least two types of phosphors, a Distributed Bragg Reflector (DBR) (or Omni-Directional Reflector (ODR)) layer may be arranged between layers.

In order to form a uniform coating layer, the phosphors may be arranged in the form of a film or a ceramic sheet and then may be attached on the LED chip or the light-emitting device.

In order to vary a light efficiency and a light distribution characteristic, a light conversion material may be positioned in a remote manner, and here, the light conversion material may be positioned together with a light-transmitting polymer material, a glass material, or the like according to durability and heat resistance of the light conversion material.

Since the phosphor spraying technology performs a major role in the determination of a light characteristic of an LED device, various techniques to control a thickness of a phosphor-coated layer, uniform distribution of the phosphors, or the like are being studied. Also, the quantum dot may be positioned at the LED chip or the light-emitting device in the same manner as the phosphors, and in this regard, the quantum dot may be positioned between glass materials or between light-transmitting polymer materials, thereby performing light conversion.

In order to protect the LED chip or the light-emitting device against an external environment or to improve an extraction efficiency of light that is externally emitted from the light-emitting device, a light-transmitting material as a filling material may be arranged on the LED chip or the light-emitting device.

Here, the light-transmitting material may be a transparent organic solvent including epoxy, silicone, a hybrid of epoxy and silicone, or the like, and may be used after being hardened via heating, light irradiation, a time-elapse, or the like.

With respect to silicone, polydimethyl siloxane is classified into a methyl-base, and polymethylphenyl siloxane is classified into a phenyl-base, and depending on the methyl-base and the phenyl-base, silicon differs in a refractive index, a water-permeation rate, light transmittance, light-fastness, and heat-resistance. Also, silicon differs in a hardening time according to a cross linker and a catalyst, thereby affecting distribution of the phosphors.

The light extraction efficiency varies according to a refractive index of the filling material, and in order to minimize a difference between a refractive index of an outermost medium of emitted blue light of the LED chip and a refractive index of the blue light that is emitted to the outside air, at least two types of silicon having different refractive indexes may be sequentially stacked.

In general, the methyl-base has the most excellent heat-resistance, and variation due to a temperature increase is decreased in order of the phenyl-base, the hybrid, and epoxy. Silicone may be divided into a gel type, an elastomer type, and a resin type according to a hardness level.

The light-emitting device may further include a lens to radially guide light that is irradiated from a light source, and in this regard, a pre-made lens may be attached on the LED chip or the light-emitting device, or a liquid organic solvent may be injected into a molding frame in which the LED chip, or the light-emitting device is mounted and then may be hardened.

The lens may be directly attached on a filling material on the LED chip or may be separated from the filling material by bonding only an outer side of the light-emitting device and an outer side of the lens. The liquid organic solvent may be injected into the molding frame via injection molding, transfer molding, compression molding, or the like.

According to a shape (e.g., a concave shape, a convex shape, a concave-convex shape, a conical shape, a geometrical shape, of the like) of the lens, the light distribution characteristic of the light-emitting device may vary, and the shape of the lens may be changed according to requirements for the light efficiency and the light distribution characteristic.

The light-emitting device may be formed as the LED chip having one of various structures or may be formed as an LED package including the LED chips and having one of various forms. Hereinafter, various types of the LED chip and the LED package that may be employed in lighting apparatuses according to one of more embodiments of the present inventive concept will be described in detail.

<LED Chip-First Embodiment>

Figure 13:
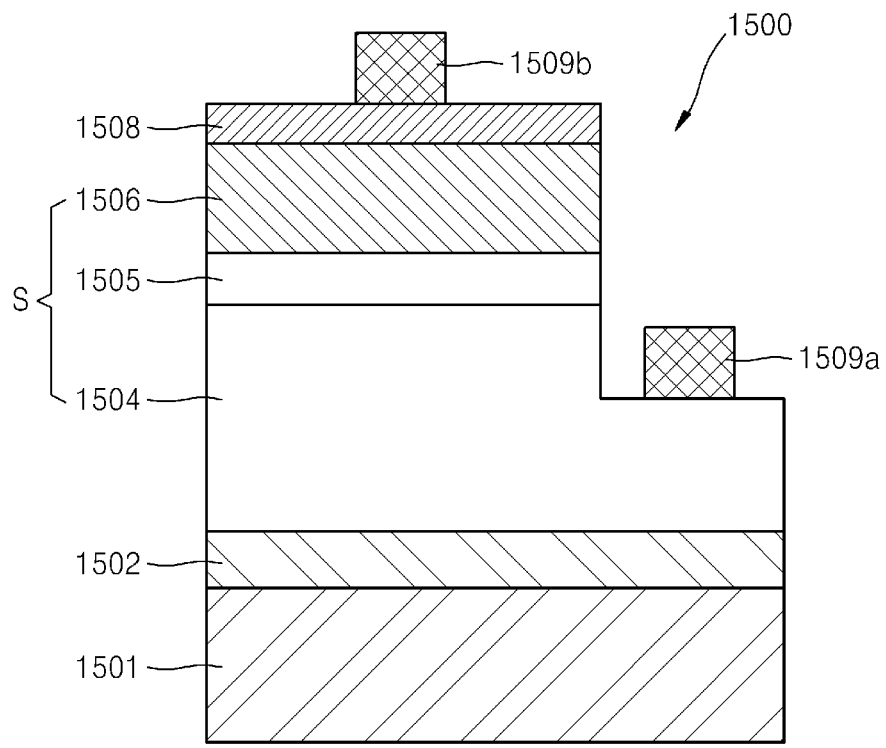
FIG. 13 is a cross-sectional side view illustrating an LED chip that may be used in a photo sensor-integrated tubular light emitting apparatus, according to an embodiment of the present inventive concept.

FIG. 13 is a cross-sectional side view illustrating an LED chip 1500 that may be used in the lighting apparatus, according to an embodiment of the present inventive concept.

As illustrated in FIG. 13, the LED chip 1500 may include an emission stack S that is formed on a substrate 1501. The emission stack S may include a first conductive semiconductor layer 1504, an active layer 1505, and a second conductive semiconductor layer 1506.

Also, the emission stack S may include an ohmic electrode layer 1508 formed on the second conductive semiconductor layer 1506. A first electrode 1509a and a second electrode 1509b may be formed on top surfaces of the first conductive semiconductor layer 1504 and an ohmic contact layer 1508, respectively.

Throughout the specification, terms such as 'upper', 'top surface', 'lower', 'bottom surface', 'side surface', or the like are based on drawings; thus, they may be changed according to a direction in which a device is actually disposed.

Hereinafter, elements of the LED chip 1500 are described in detail.

According to necessities, the substrate 1501 may be formed of an insulating substrate, a conductive substrate, or a semiconductor substrate. For example, the substrate 1501 may be formed of sapphire, SiC, Si, $MgAl_2O_4$, MgO, $LiAlO_2$, $LiGaO_2$, or GaN. For an epitaxial growth of a GaN material, a GaN substrate that is a homogeneous substrate may be used; however the GaN substrate may have a high production cost due to difficulty in its manufacture.

An example of a heterogeneous substrate may include a sapphire substrate, silicon carbide (SiC) substrate, or the like, and in this regard, the sapphire substrate may be used more than the SiC substrate, which is expensive. When the heterogeneous substrate is used, a defect such as dislocation or the like may be increased due to a difference between lattice constants of a substrate material and a thin-film material. Also, due to a difference between thermal expansion coefficients of the substrate material and the thin-film material, the substrate 1501 may be bent when a temperature is changed, and the bend may cause a crack of a thin-film. The aforementioned problem may be decreased by using a buffer layer 1502 between the substrate 1501 and the emission stack S that includes a GaN material.

In order to improve an optical or electrical characteristic of the LED chip 1500 before or after an LED structure growth, the substrate 1501 may be completely or partly removed or may be patterned while a chip is manufactured.

For example the sapphire substrate may be separated in a manner in which a laser is irradiated to an interface between the sapphire substrate and a semiconductor layer, and a silicon substrate or the SiC substrate may be removed by using a grinding method, an etching method, or the like.

When the substrate 1501 is removed, another supporting substrate may be used, and the supporting substrate may be bonded to the other side of an original growth substrate by using a reflective metal material or may be formed by inserting a reflection structure into an adhesion layer, so as to improve an optical efficiency of the LED chip 1500.

A patterning operation on a substrate may be performed by forming an uneven or slope surface on a main side (e.g., a top surface or both surfaces) or side surfaces of the substrate before or after a growth of an LED structure, and by doing so, a light extraction efficiency is improved. A size of a pattern may be selected in a range from 5 nm to 500 µm, and in order to improve the light extraction efficiency, a regular pattern or an irregular pattern may be selected. In addition, a shape of the pattern may be a column, a cone, a hemisphere, a polygonal shape, or the like.

The sapphire substrate may include crystals having a hexagonal-rhombohedral (Hexa-Rhombo R3c) symmetry in which lattice constants of the crystal in c-axial and a-lateral directions are 13.001 and 4.758, respectively, and the crystal has a C (0001) surface, an A (1120) surface, an R(1102) surface, or the like. In this case, the C (0001) surface easily facilitates the growth of a nitride thin-film, and is stable at a high temperature, so that the C (0001) surface may be used as a substrate for the growth of nitride.

The substrate may be formed as an Si substrate that is more appropriate for a large diameter and has a relatively low price, so that mass production may be improved. However, since the Si substrate having a (111) surface as a substrate surface has a lattice constant difference of about 17% with GaN, a technology may be required to suppress occurrence of a defective crystal due to the lattice constant difference. In addition, a thermal expansion difference between silicon and GaN is about 56%, so that a technology may be required to suppress wafer bend caused due to the thermal expansion difference. Due to the wafer bend, a GaN thin-film may have a crack, and it may be difficult to perform a process control such that dispersion of emission wavelength in a same wafer may be increased.

Since the Si substrate absorbs light that is generated in a GaN-based semiconductor, an external quantum efficiency of the light-emitting device 10 (see FIG. 18) may deteriorate, so that the Si substrate may be removed, and a supporting substrate such as Si, Ge, SiAl, ceramic, or metal substrates including a reflective layer may be additionally formed and then be used.

When the GaN thin-film is grown on a heterogeneous substrate such as the Si substrate, a dislocation density may be increased due to a mismatch between lattice constants of a substrate material and a thin-film material, and the crack and the bend may occur due to the thermal expansion difference. In order to prevent the dislocation and the crack of the emission stack S, the buffer layer 1502 may be disposed between the substrate 1501 and the emission stack S. The buffer layer 1502 may decrease the dispersion of the emission wavelength of the wafer by adjusting a bending level of the substrate while the active layer is grown.

The buffer layer 1502 may be formed of $Al_xIn_yGa1-x-yN$ ($0 \le x \le 1$, $0 \le y \le 1$), in particular, GaN, AlN, AlGaN, InGaN, or InGaNAlN, and when required, the buffer layer 1502 may be formed of $ZrB_2$, $HfB_2$, ZrN, HfN, TiN, or the like. Also, the buffer layer 1502 may be formed by combining a plurality of layers or by gradually varying composition of one of the aforementioned materials.

Since the Si substrate and the GaN thin-film has the large thermal expansion difference, when the GaN thin-film is grown on the Si substrate, the GaN thin-film may be grown at a high temperature and then may be cooled at a room temperature, and at this time, a tensile stress may be applied to the GaN thin-film due to the thermal expansion difference between the Si substrate and the GaN thin-film, such that a crack in the GaN thin-film may easily occur. In order to prevent the crack, a compressive stress may be applied to the GaN thin-film while the GaN thin-film is grown, so that the tensile stress may be compensated.

Due to the lattice constant difference between the Si substrate and the GaN thin-film, the Si substrate may be defective. When the Si substrate is used, a buffer layer having a composite structure may be used so as to simultaneously perform a defect control and a stress control to suppress the bend.

For example, AlN may be first formed on the substrate 1501. In order to prevent reaction between Si and Ga, it may be required to use a material that does not contain Ga. Not only AlN but also SiC may be used. AlN may be grown by using Al and N sources at a temperature between 400 through 1300 degrees. An AlGaN intermediate layer may be inserted into a plurality of AlN layers so as to control a stress.

The emission stack S having a multi-layer structure of the group-III nitride semiconductor is now described in detail. The first and second conductive semiconductor layers 1504 and 1506 may be formed of semiconductors that are doped with n-type and p-type impurities, respectively, or vice versa. For example, each of the first and second conductive semiconductor layers 1504 and 1506 may be formed of, but is not limited to, the group-III nitride semiconductor, e.g., a material having a composition of $Al_xIn_yGa1-x-yN$ ($0 \le x \le 1$, $0 \le y \le 1$, $0 \le x+y \le 1$). In another embodiment, each of the first and second conductive semiconductor layers 1504 and 1506 may be formed of a material including an AlGaInP-based semiconductor, an AlGaAs-based semiconductor, or the like.

Each of the first and second conductive semiconductor layers 1504 and 1506 may have a single-layer structure. However, each of the first and second conductive semiconductor layers 1504 and 1506 may have a multi-layer structure including a plurality of layers having different compositions or thicknesses. For example, each of the first and second conductive semiconductor layers 1504 and 1506 may have a carrier injection layer capable of improving an efficiency of electron and hole injection, and may also have a superlattice structure having various forms.

The first conductive semiconductor layer 1504 may further include a current diffusion layer (not separately shown) that is adjacent to the active layer 1505. The current diffusion layer may have a structure in which a plurality of $In_xAl_yGa(1-x-y)N$ layers having different compositions or different impurity ratios are repeatedly stacked, or may be partially formed of an insulation material layer.

The second conductive semiconductor layer 1506 may further include an electron block layer (not separately shown) that is adjacent to the active layer 1505. The electron block layer may have a structure in which a plurality of $In_xAl_yGa(1-x-y)N$ layers having different compositions are stacked or may have at least one layer formed of $Al_yGa(1-y)N$. Since the electron block layer has a bandgap larger than that of the active layer 1505, the electron block layer may prevent electron from entering to the second conductive semiconductor layer 1506 (that is, for example, a p-type).

The emission stack S may be formed by using an MOCVD apparatus. In more detail, the emission stack S may be formed in a manner in which a reaction gas such as an organic metal compound gas (e.g., trimethyl gallium (TMG), trimethyl aluminum (TMA), or the like) and a nitrogen containing gas (e.g. ammonia ($NH_3$), or the like) are injected into a reaction container in which the substrate

1501 is arranged and the substrate 1501 is maintained at a high temperature of about 900 through 1100 degrees, while a gallium-based compound semiconductor is grown on the substrate 1501, if required, an impurity gas is injected, so that the gallium-based compound semiconductor is stacked as an undoped-type, an n-type, or a p-type. Si is well known as n-type impurity. Zn, Cd, Be, Mg, Ca, Ba, or the like, in particular, Mg and Zn, may be used as p-type impurity.

The active layer 1505 that is disposed between the first and second conductive semiconductor layers 1504 and 1506 may have a multi-quantum well (MQW) structure in which a quantum well layer and a quantum barrier layer are alternately stacked. For example, in a case of a nitride semiconductor, the active layer 1505 may have a GaN/InGaN structure. However, in another embodiment, the active layer 1505 may have a single-quantum well (SQW) structure.

The ohmic electrode layer 1508 may decrease an ohmic contact resistance by relatively increasing an impurity density, so that the ohmic electrode layer 1508 may decrease an operating voltage and may improve a device characteristic. The ohmic electrode layer 1508 may be formed of GaN, InGaN, ZnO, or a graphene layer.

The first electrode 1509a or the second electrode 1509b may include a material such as Ag, Ni, Al, Rh, Pd, Ir, Ru, Mg, Zn, Pt, Au, or the like, or may have a multi-layer structure including Ni/Ag, Zn/Ag, Ni/Al, Zn/Al, Pd/Ag, Pd/Al, Ir/Ag. Ir/Au, Pt/Ag, Pt/Al, Ni/Ag/Pt, or the like.

While the LED chip 1500 shown in FIG. 13 has a structure in which the first electrode 1509a, the second electrode 1509b, and a light extraction surface face the same side, the LED chip 1500 may have various structures such as a flip-chip structure in which the first electrode 1509a and the second electrode 1509b face the opposite side of the light extraction surface, a vertical structure in which the first electrode 1509a and the second electrode 1509b are formed on opposite surfaces, a vertical and horizontal structure employing an electrode structure in which a plurality of vias are formed in a chip so as to increase an efficiency of current distribution and heat dissipation.

<LED Chip-Second Embodiment>

Figure 14:
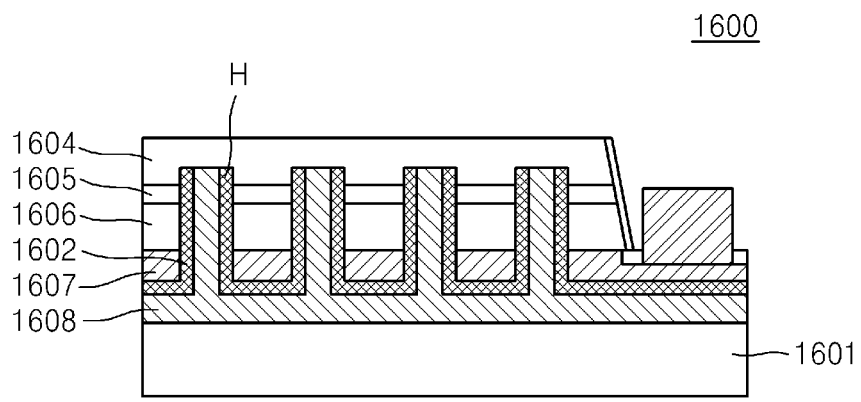
FIG. 14 is a cross-sectional side view illustrating an LED chip that may be used in a photo sensor-integrated tubular light emitting apparatus, according to another embodiment of the present inventive concept.

FIG. 14 illustrates an LED chip 1600 having a structure for increasing an efficiency of current distribution and heat dissipation, when a large area light-emitting device chip for a high output for a lighting apparatus is manufactured, according to another embodiment of the present inventive concept.

As illustrated in FIG. 14, the LED chip 1600 may include a first conductive semiconductor layer 1604, an active layer 1605, a second conductive semiconductor layer 1606, a second electrode layer 1607, an insulating layer 1602, a first electrode layer 1608, and a substrate 1601. Here, in order to be electrically connected to the first conductive semiconductor layer 1604, the first electrode layer 1608 may include one or more contact holes H that are electrically insulated from the second conductive semiconductor layer 1606 and the active layer 1605 and that extend from a surface of the first electrode layer 1608 to a portion of the first conductive semiconductor layer 1604.

The contact hole H may extend from an interface of the first electrode layer 1608 to an inner surface of the first conductive semiconductor layer 1604 via the second conductive semiconductor layer 1606 and the active layer 1605. The contact hole H may extend to an interface between the active layer 1605 and the first conductive semiconductor layer 1604, and more preferably, the contact hole H may extend to the portion of the first conductive semiconductor layer 1604. Since the contact hole H functions to perform electrical connection and current distribution of the first conductive semiconductor layer 1604, the contact hole H may achieve its purpose when the contact hole H contacts the first conductive semiconductor layer 1604, thus, it may not be required for the contact hole to extend to an outer surface of the first conductive semiconductor layer 1604.

The second electrode layer 1607 that is formed on the second conductive semiconductor layer 1606 may be formed of a material selected from the group consisting of Ag, Ni, Al, Rh, Pd, Ir, Ru, Mg, Zn, Pt, and Au, in consideration of a light reflection function and an ohmic contact with the second conductive semiconductor layer 1606, and may be formed via a sputtering process or a deposition process.

The contact hole H may have a shape that penetrates through the second electrode layer 1607, the second conductive semiconductor layer 1606, and the active layer 1605 so as to be connected with the first conductive semiconductor layer 1604. The contact hole H may be formed via an etching process using ICP-RIE or the like.

The insulating layer 1602 may be formed to cover side walls of the contact hole H and a top surface of the second conductive semiconductor layer 1606. In this case, a portion of the first conductive semiconductor layer 1604 that corresponds to a bottom surface of the contact hole H may be exposed. The insulating layer 1602 may be formed by depositing an insulation material such as $SiO_2$, $SiO_xN_y$, $Si_xN_y$, or the like.

The second electrode layer 1607 may include a conductive via formed by filling a conductive material and may be formed in the contact hole H. Afterward, the substrate 1601 may be formed on the first electrode layer 1608. In this structure, the substrate 1601 may be electrically connected to the first conductive semiconductor layer 1604 via the conductive via that contacts the first conductive semiconductor layer 1604.

The substrate 1601 may be formed of, but is not limited to, a material selected from Au, Ni, Al, Cu, W, Si, Se, GaAs, SiAl, Ge, SiC, AlN, $Al_2O_3$, GaN, and AlGaN, via a plating process, a sputtering process, a deposition process, or an adhesion process.

In order to decrease a contact resistance of the contact hole H, a total number of the contact holes H, a shape of the contact hole H, a pitch of the contact hole H, a contact area of the contact hole H with respect to the first and second conductive semiconductor layers 1604 and 1606, or the like may be appropriately adjusted, and since the contact holes H are arrayed in various forms along lines and columns, a current flow may be improved.

<LED Chip-Third Embodiment>

Since an LED lighting apparatus provides an improved heat dissipation characteristic, an LED chip having a small calorific value may be applied to the LED lighting apparatus, in consideration of a total heat dissipation performance. An example of the LED chip may be an LED chip having a nano structure (hereinafter, referred to as a "nano LED chip").

An example of the nano LED chip may include a core-shell type nano LED chip. The core-shell type nano LED chip may generate a relatively small amount of heat due to its small combined density, and increase its emission area by using the nano structure so as to increase an emission efficiency. Also, the core-shell type nano LED chip may obtain a non-polar active layer, thereby preventing efficiency deterioration due to polarization, so that a drop characteristic may be improved.

Figure 15:
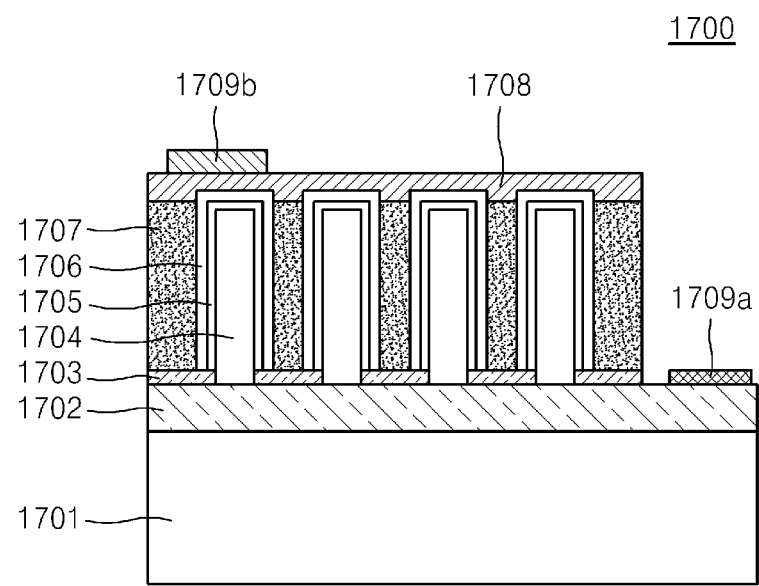
FIG. 15 is a cross-sectional side view illustrating an LED chip that may be used in a photo sensor-integrated tubular light emitting apparatus, according to another embodiment of the present inventive concept.

FIG. 15 illustrates a nano LED chip 1700 that may be applied to the lighting apparatus, according to another embodiment of the present inventive concept.

As illustrated in FIG. 15, the nano LED chip 1700 may include a plurality of nano emission structures (not separately shown) that are formed on a substrate 1701. In an embodiment of the present inventive concept, the nano emission structure may have a rod structure as a core-shell structure, but in another embodiment, the nano emission structure may have a different structure such as a pyramid structure.

The nano LED chip 1700 may include a base layer 1702 formed on the substrate 1701. The base layer 1702 may be a layer to provide a growth surface for the nano emission structures and may be formed of a first conductive semiconductor. A mask layer 1703 having open areas for a growth of the nano emission structures (in particular, a core) may be formed on the base layer 1702. The mask layer 1703 may be formed of a dielectric material such as $SiO_2$ or SiNx.

In the nano emission structure, a first conductive nano core 1704 may be formed by selectively growing the first conductive semiconductor by using the mask layer 1703 having open areas, and an active layer 1705 and a second conductive semiconductor layer 1706 may be formed as a shell layer on a surface of the first conductive nano core 1704. By doing so, the nano emission structure may have a core-shell structure in which the first conductive semiconductor is a nano core, and the active layer 1705 and the second conductive semiconductor layer 1706 that surround the nano core are the shell layer.

In an embodiment of the present inventive concept, the nano LED chip 1700 may include a filling material 1707 that fills gaps between the nano emission structures. The filling material 1707 may structurally stabilize the nano emission structures. The filling material 1707 may include, but is not limited to, a transparent material such as $SiO_2$. An ohmic contact layer 1708 may be formed on the nano emission structure so as to contact the second conductive semiconductor layer 1706. The nano LED chip 1700 may include first and second electrodes 1709a and 1709b that contact the base layer 1702, which is formed of the first conductive semiconductor, and the ohmic contact layer 1708, respectively.

By varying a diameter, a component, or a doping density of the nano emission structure, light having at least two different wavelengths may be emitted from one device. By appropriately adjusting the light having the different wavelengths, white light may be realized in the one device without using a phosphor. In addition, by combining the one device with another LED chip or combining the one device with a wavelength conversion material such as a phosphor, light having desired various colors or white light having different color temperatures may be realized.

<LED Chip-Fourth Embodiment>

Figure 16:
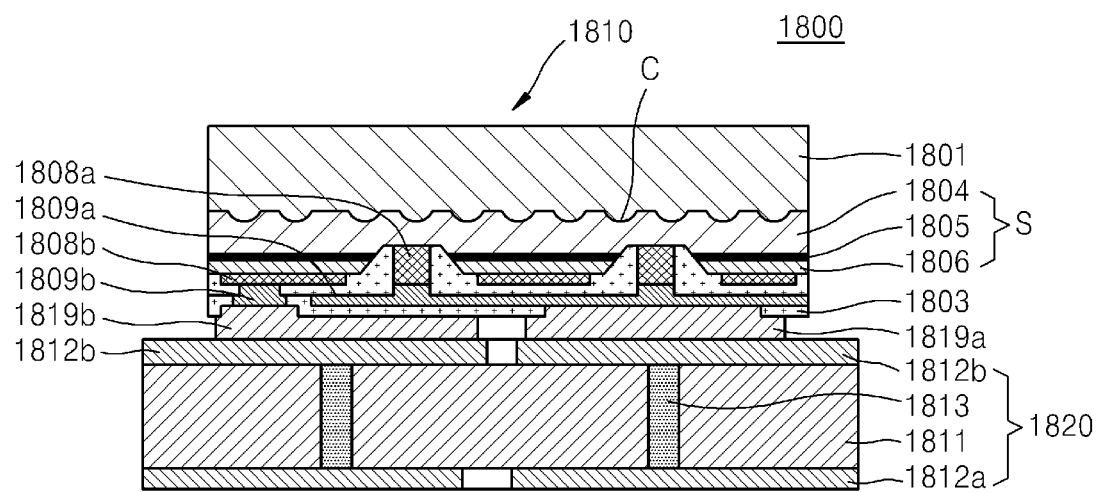
FIG. 16 illustrates a semiconductor light-emitting device that includes an LED chip mounted at a substrate and that may be used in a photo sensor-integrated tubular light emitting apparatus, according to an embodiment of the present inventive concept.

FIG. 16 illustrates a semiconductor light-emitting device 1800 that is a light source to be applied to the lighting apparatus and that includes an LED chip 1810 mounted on a mounting substrate 1820, according to an embodiment of the present inventive concept.

The semiconductor light-emitting device 1800 shown in FIG. 16 may include the mounting substrate 1820 and the LED chip 1810 that is mounted on the mounting substrate 1820. The LED chip 1810 may be different from the LED chips in the aforementioned embodiments.

The LED chip 1810 may include an emission stack S that is disposed on a surface of the substrate 1801, and first and second electrodes 1808a and 1808b that are disposed on the other surface of the substrate 1801 with respect to the emission stack S. Also, the LED chip 1810 may include an insulation unit 1803 to cover the first and second electrodes 1808a and 1808b.

The first and second electrodes 1808a and 1808b may include first and second electrode pads 1819a and 1819b via first and second electric power connection units 1809a and 1809b.

The emission stack S may include a first conductive semiconductor layer 1804, an active layer 1805, and a second conductive semiconductor layer 1806 that are sequentially disposed on the substrate 1801. The first electrode 1808a may be provided as a conductive via that contacts the first conductive semiconductor layer 1804 by penetrating through the second conductive semiconductor layer 1806 and the active layer 1805. The second electrode 1808b may contact the second conductive semiconductor layer 1806.

The insulation unit 1803 may have an open area to expose a portion of the first and second electrodes 1808a and 1808b. The first and second electrode pads 1819a and 1819b may contact the first and second electrodes 1808a and 1808b.

The first and second electrodes 1808a and 1808b may have a single-layer structure or a multi-layer structure formed of a conductive material making an ohmic contact with the first and second conductive semiconductor layers 1804 and 1806, respectively. For example, the first and second electrodes 1808a and 1808b may be formed by depositing or sputtering at least one material selected from Ag, Al, Ni, Cr, and transparent conductive oxide (TCO). The first and second electrodes 1808a and 1808b may be disposed in the same direction, and as will be described later, the first and second electrodes 1808a and 1808b may be mounted in the form of a flip-chip in a lead frame. In this case, the first and second electrodes 1808a and 1808b may be disposed to face in the same direction.

In particular, a first electric power connection unit 1809a may be formed by the first electrode 1808a having a conductive via that penetrates through the active layer 1805 and the second conductive semiconductor layer 1806 and then is connected to the first conductive semiconductor layer 1804 in the emission stack S.

In order to decrease a contact resistance between the conductive via and the first electric power connection unit 1809a, a total number, shapes, pitches, a contact area with the first conductive semiconductor layer 1804, or the like of the conductive via and the first electric power connection unit 1809a may be appropriately adjusted. Since the conductive via and the first electric power connection unit 1809a are arrayed in rows and columns, a current flow may be improved.

An electrode structure of the other side of the semiconductor light-emitting device 1800 may include the second electrode 1808b that is directly formed on the second conductive semiconductor layer 1806, and the second electric power connection unit 1809b that is formed on the second electrode 1808b. The second electrode 1808b may function to form an electrical ohmic connection with the second electric power connection unit 1809b and may be formed of a light reflection material, so that, when the LED chip 1810 is mounted as a flip-chip structure as illustrated in FIG. 16, the second electrode 1808b may efficiently discharge light, which is emitted from the active layer 1805, toward the substrate 1801. According to a major light emission direction, the second electrode 1808b may be formed of a light-transmitting conductive material such as transparent conductive oxide.

The aforementioned two electrode structures may be electrically separated from each other by using the insulation unit 1803. Any material or any object having an electrical insulation property may be used as the insulation unit 1803, but a material having a low light-absorption property may be used. For example, silicon oxide or silicon nitride such as $SiO_2$, SiOxNy, SixNy or the like may be used. The insulation unit 1803 may have a light reflection structure in which a light reflective filler is distributed throughout a light transmitting material.

The first and second electrode pads 1819a and 1819b may be connected to the first and second electric power connection units 1809a and 1809b, respectively, and thus may function as external terminals of the LED chip 1810. For example, the first and second electrode pads 1819a and 1819b may be formed of Au, Ag, Al, Ti, W, Cu, Sn, Ni, Pt, Cr, NiSn, TiW, AuSn, or a eutectic alloy thereof. In this case, when the first and second electrode pads 1819a and 1819b are mounted on the mounting substrate 1820, the first and second electrode pads 1819a and 1819b may be bonded to mounting substrate 1820 by using eutectic metal, so that a separate solder bump that is generally used in flip-chip bonding may not be used. Compared to a case of using the solder bump, the mounting method using the eutectic metal may achieve a more excellent heat dissipation effect. In this case, in order to obtain the excellent heat dissipation effect, the first and second electrode pads 1819a and 1819b may be formed while having large areas.

The substrate 1801 and the emission stack S may be understood by referring to the description with reference to FIG. 16, unless contrary description is provided. Also, although not particularly illustrated in FIG. 16, a buffer layer (not shown) may be formed between the emission stack S and the substrate 1801, and in this regard, the buffer layer may be formed as a undoped semiconductor layer including nitride or the like, so that the buffer layer may decrease a lattice defect of an emission structure that is grown on the buffer layer.

The substrate 1801 may have first and second primary surfaces that face each other, and in this regard, a convex-concave structure C may be formed on at least one of the first and second primary surfaces. The convex-concave structure C that is arranged on one surface of the substrate 1801 may be formed of the same material as the substrate 1801 since a portion of the substrate 1801 is etched, or may be formed of a different material from the substrate 1801.

As in an embodiment of the present inventive concept, since the convex-concave structure C is formed at an interface between the substrate 1801 and the first conductive semiconductor layer 1804, a path of light emitted from the active layer 1805 may vary, such that a rate of light that is absorbed in the semiconductor layer may be decreased and a light-scattering rate may be increased; thus, the light extraction efficiency may be increased.

In more detail, the convex-concave structure C may have a regular shape or an irregular shape. Heterogeneous materials that form the convex-concave structure C may include a transparent conductor, a transparent insulator, or a material having excellent reflectivity, and in this regard, the transparent insulator may include, but is not limited to, $SiO_2$, SiNx, $Al_2O_3$, HfO, $TiO_2$ or ZrO, the transparent conductor may include, but is not limited to, TCO such as indium oxide containing ZnO or an additive including Mg, Ag, Zn, Sc, Hf, Zr, Te, Se, Ta, W, Nb, Cu, Si, Ni, Co, Mo, Cr, or Sn, and the reflective material may include, but is not limited to, Ag, Al, or DBR that is formed of a plurality of layers having different refractive indexes.

The substrate 1801 may be removed from the first conductive semiconductor layer 1804. In order to remove the substrate 1801, a laser lift off (LLO) process using a laser, an etching process, or a grinding process may be performed. After the substrate 1801 is removed, the convex-concave structure C may be formed on a top surface of the first conductive semiconductor layer 1804.

As illustrated in FIG. 16, the LED chip 1810 may be mounted on the mounting substrate 1820. The mounting substrate 1820 may have a structure in which upper and lower electrode layers 1812b and 1812a are formed on a top surface and a bottom surface of a substrate body 1811, respectively, and a via 1813 penetrates through the substrate body 1811 so as to connect the upper and lower electrode layers 1812b and 1812a. The substrate body 1811 may be formed of resin, ceramic, or metal. The upper and lower electrode layers 1812b and 1812a may be metal layers including Au, Cu, Ag, Al, or the like.

An example of a substrate on which the LED chip 1810 is mounted is not limited to the mounting substrate 1820 of FIG. 16, and thus any substrate having a wiring structure to drive the LED chip 1810 may be used. For example, it is possible to provide a package structure in which the LED chip 1810 is mounted in a package body having a pair of lead frames.

<LED Chip-Additional Embodiment>

An LED chip having one of various structures may be used, other than the aforementioned LED chips. For example, it is possible to use an LED chip having a light extraction efficiency that is significantly improved by interacting a quantum well exciton and surface-plasmon polaritons (SPP) formed at an interface between metal and dielectric layers of the LED chip.

<LED Package>

The aforementioned various LED chips may be mounted as bare chips on a circuit board and then may be used in the lighting apparatus. However, unlike this, the LED chips may be also alternatively used in various package structures that are mounted in a package body having a pair of electrodes.

A package including the LED chip (hereinafter, referred to as an LED package) may have not only an external terminal structure that is easily connected to an external circuit but also may have a heat dissipation structure for improvement of a heat dissipation characteristic of the LED chip and various optical structures for improvement of a light characteristic of the LED chip. For example, the various optical structures may include a wavelength conversion unit that converts light emitted from the LED chip into light having a different wavelength, or may include a lens structure for improvement of a light distribution characteristic of the LED chip.

<Example of the LED Package-Chip Scale Package (CSP)>

The example of the LED package that may be used in the lighting apparatus may include an LED chip package having a CSP structure.

The CSP may reduce a size of the LED chip package, may simplify the manufacturing procedure, and may be appropriate for mass production. In addition, an LED chip, wavelength conversion materials such as phosphors, and an optical structure such as a lens may be integrally manufactured, so that the CSP may be designed as appropriate for the lighting apparatus.

Figure 17:
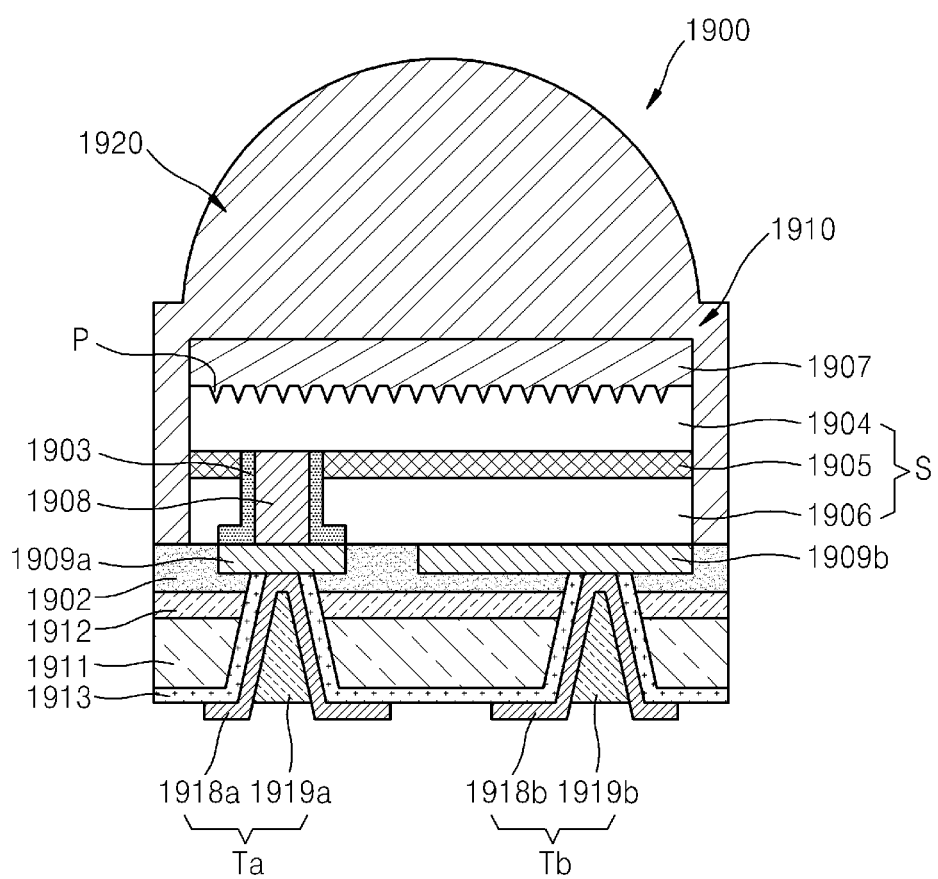
FIG. 17 illustrates an LED package that may be used in a photo sensor-integrated tubular light emitting apparatus, according to an embodiment of the inventive concept.

FIG. 17 illustrates an example of the CSP that has a package structure in which an electrode is formed via a bottom surface of an LED 1910 that is in an opposite direction of a primary light extraction surface, and a phosphor layer 1907 and a lens 1920 are integrally formed, according to an embodiment of the present inventive concept.

A CSP 1900 shown in FIG. 17 may include an emission stack S disposed on a mounting substrate 1911, first and second terminals Ta and Tb, the phosphor layer 1907, and the lens 1920.

The emission stack S may have a stack structure including first and second semiconductor layers 1904 and 1906, and an active layer 1905 disposed between the first and second semiconductor layers 1904 and 1906. In an embodiment of the present inventive concept, the first and second semiconductor layers 1904 and 1906 may be p-type and n-type semiconductor layers, respectively, and may be formed of a nitride semiconductor such as AlxInyGa(1-x-y)N ($0 \leq x \leq 1$, $0 \leq y \leq 1$, $0 \leq x+y \leq 1$). Alternatively, the first and second semiconductor layers 1904 and 1906 may be formed of a GaAs-based semiconductor or a GaP-based semiconductor, other than the nitride semiconductor.

The active layer 1905 may be disposed between the first and second semiconductor layers 1904 and 1906, and may emit light that has a predetermined energy due to recombination of electrons and holes and may have a MQW structure in which a quantum well layer and a quantum barrier layer are alternately stacked. The MQW structure may include an InGaN/GaN structure or a AlGaN/GaN structure.

The first and second semiconductor layers 1904 and 1906, and the active layer 1905 may be formed via a semiconductor layer growing procedure such as MOCVD, MBE, HVPE, or the like.

In the LED 1910 shown in FIG. 17, a growth substrate may be already removed, and a concave-convex structure P may be formed on a surface of the LED 1910 from which the growth substrate is removed. Also, the phosphor layer 1907 may be formed as a light conversion layer on the surface whereon the concave-convex structure P is formed.

Similar to the LED chip 1810 of FIG. 16, the LED 1910 may have first and second electrodes 1909*a* and 1909*b* that contact the first and second semiconductor layers 1904 and 1906, respectively. The first electrode 1909*a* may have a conductive via 1908 that contacts the first semiconductor layer 1904 by penetrating through the second semiconductor layer 1906 and the active layer 1905. The conductive via 1908 may have an insulating layer 1903 formed between the active layer 1905 and the second semiconductor layer 1906, thereby preventing a short.

Referring to FIG. 17, one conductive via 1908 may be arranged, but in another embodiment, at least two conductive vias 1908 may be arranged for improved current distribution and may be arrayed in various forms.

The mounting substrate 1911 may be a supporting substrate such as a silicon substrate to be easily applied to a semiconductor procedure, but examples of the mounting substrate 1911 may vary. The mounting substrate 1911 and the LED 1910 may be bonded to each other via bonding layers 1902 and 1912. The bonding layers 1902 and 1912 may be formed of an electrical insulation material or an electrical conduction material, and in this regard, examples of the electrical insulation material may include oxide such as SiO$_2$, SiN, or the like, or resin materials including a silicon resin, an epoxy resin, or the like, and examples of the electrical conduction material may include Ag, Al, Ti, W, Cu, Sn, Ni, Pt, Cr, NiSn, TiW, AuSn, or a eutectic metal thereof. The bonding process may be performed in a manner in which the bonding layers 1902 and 1912 are arranged on bonding surfaces of the LED 1910 and the mounting substrate 1911 and then are bonded together.

A via that penetrates through the mounting substrate 1911 may be formed at a bottom surface of the mounting substrate 1911 so as to contact the first and second electrodes 1909*a* and 1909*b* of the bonded LED 1910. Then, an insulator 1913 may be formed on a side surface of the via and the bottom surface of the mounting substrate 1911. When the mounting substrate 1911 is formed as a silicon substrate, the insulator 1913 may be arranged as a silicon oxide layer that is formed via a thermal oxidation procedure. By filling the via with a conductive material, the first and second terminals Ta and Tb may be formed to be connected to the first and second electrodes 1909*a* and 1909*b*. The first and second terminals Ta and Tb may include seed layers 1918*a* and 1918*b*, and plating charging units 1919*a* and 1919*b* that are formed by using the seed layers 1918*a* and 1918*b* via a plating procedure.

Figure 18:
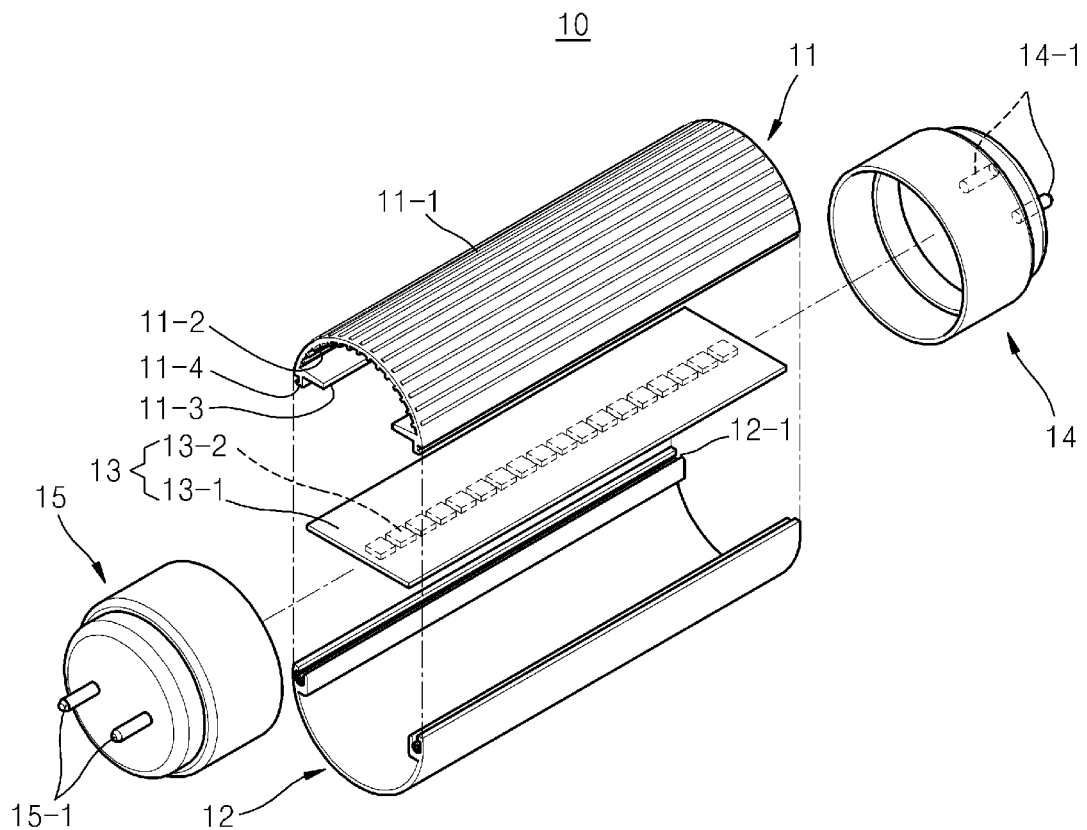
FIG. 18 is an exploded perspective view of a photo sensor-integrated tubular light emitting apparatus according to an embodiment of the present inventive concept.

FIG. 18 is an exploded perspective view of a photo sensor-integrated tubular light emitting apparatus 10 according to the embodiment of the present inventive concept.

As illustrated in FIG. 18, the photo sensor-integrated tubular light emitting apparatus 10 may include the heat dissipation member 11, the cover 12, the light-emitting module 13, the first socket 14, and the second socket 15.

A plurality of heat dissipation pins 11-1 and 11-2 may be formed in a concave-convex structure on inner and/or outer surfaces of the heat dissipation member 11, and in this regard, it is possible to design the heat dissipation pins 11-1 and 11-2 to have various shapes and intervals. A projected supporting unit 11-3 may be formed at an inner side of the heat dissipation member 11. The light-emitting module 13 may be fixed to the supporting unit 11-3. A projection 11-4 may be formed at both ends of the heat dissipation member 11.

A projection groove 12-1 may be formed at the cover 12, and the projection 11-4 of the heat dissipation member 11 may be combined with the projection groove 12-1 in a hook-combination manner. For example, positions of the projection 11-4 and the projection groove 12-1 may be switched.

The light-emitting module 13 may include the PCB 13-1 and an LED array 13-2. The PCB 13-1 may include circuit wirings to operate the LED array 13-2. Also, circuit configuration elements to operate the LED array 13-2 may be included in the PCB 13-1.

The first and second sockets 14 and 15 may be a pair of sockets and may be combined with ends of the cylindrical cover unit that is formed of the heat dissipation member 11 and the cover 12.

For example, an electrode terminal 14-1 may be disposed at the first socket 14, and a dummy terminal 15-1 may be disposed at the second socket 15. Also, a photo sensor module (not separately shown) may be mounted in one of the first socket 14 and the second socket 15.

In an embodiment, the photo sensor module may be mounted in the second socket 15 at which the dummy terminal 15-1 is disposed. In another embodiment, the photo sensor module may be mounted in the first socket 14 at which the electrode terminal 14-1 is disposed. Alternatively, in another embodiment, the photo sensor module may be mounted in the second socket 15 at which the dummy terminal 15-1 is disposed, and a power supply unit (not separately shown) may be mounted in the first socket 14 at which the electrode terminal 14-1 is disposed.

Figure 19:
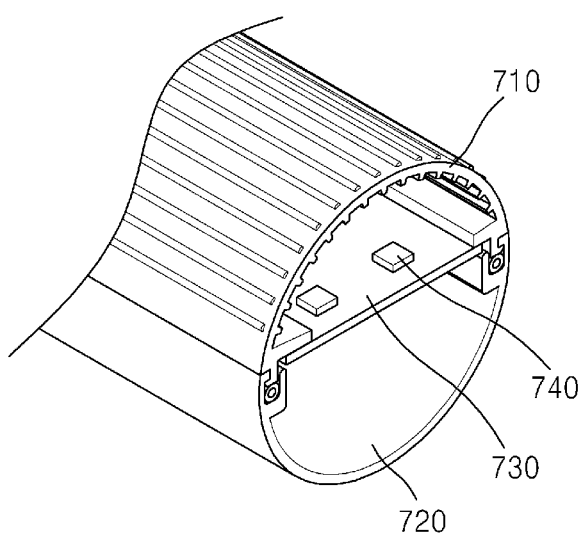
FIG. 19 illustrates a photo sensor-integrated tubular light emitting apparatus that is applied to an L-tube assembly, according to another embodiment of the present inventive concept.

FIG. 19 illustrates a photo sensor-integrated tubular light emitting apparatus that is applied to an L-tube assembly, according to another embodiment of the present inventive concept.

Referring to FIG. 19, the L-tube assembly of the photo sensor-integrated tubular light emitting apparatus may include a cover 710, a heat sink 720, a PCB 730, and an LED package 740.

The cover 710 may be designed to have a serration pattern at an inner surface of the cover 710 so as to improve light distribution.

The heat sink 720 may be designed to be combined with the cover 710.

A cylindrical tube formed by combining the heat sink 720 and the cover 710 may have a structure capable of having the PCB 730 fixed therein. Then, the LED package 740 may be mounted on the PCB 730. For example, the LED package 740 may be disposed in two arrays on the PCB 730.

Figure 20:
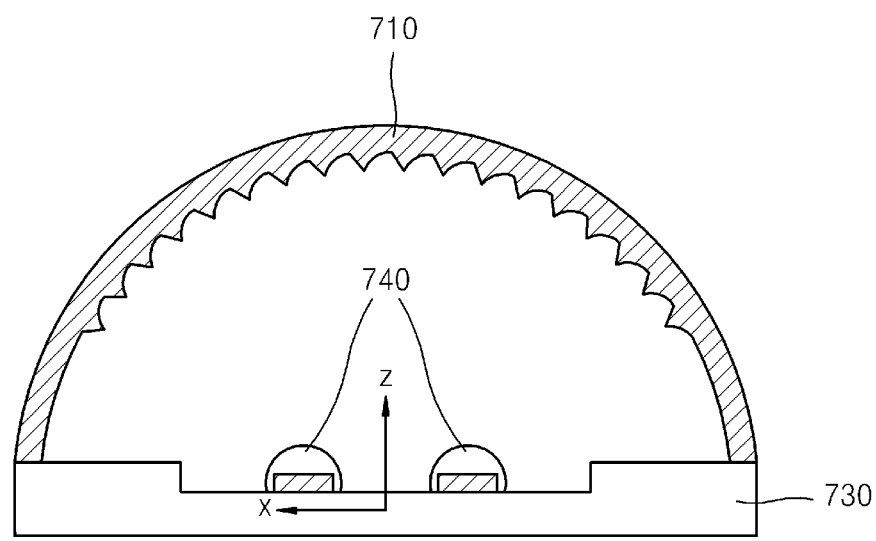
FIG. 20 is a cross-sectional view illustrating primary parts of the L-tube assembly shown in FIG. 19.

FIG. 20 is a cross-sectional view illustrating primary parts of the L-tube assembly shown in FIG. 19.

Referring to FIG. 20, the serration pattern may be formed on the inner surface of the cover 710 of the L-tube assembly. By forming the serration pattern on the inner surface of the cover 710, a center beam may be diffused left and right. Due to the diffusion, a distribution angle may be enlarged to about 90 through 270 degrees. The cover 710 may be formed of a transparent material and may contain a diffuser. Also, an outer surface of the cover 710 may be sanded.

The LED package 740 may be disposed in the two arrays on the PCB 730 that is fixed in the cover 710.

At the L-tube assembly, a reflectance of the heat sink 720 may be about 50%, and a reflectance of the PCB 730 may be about 70%.

Figure 21:
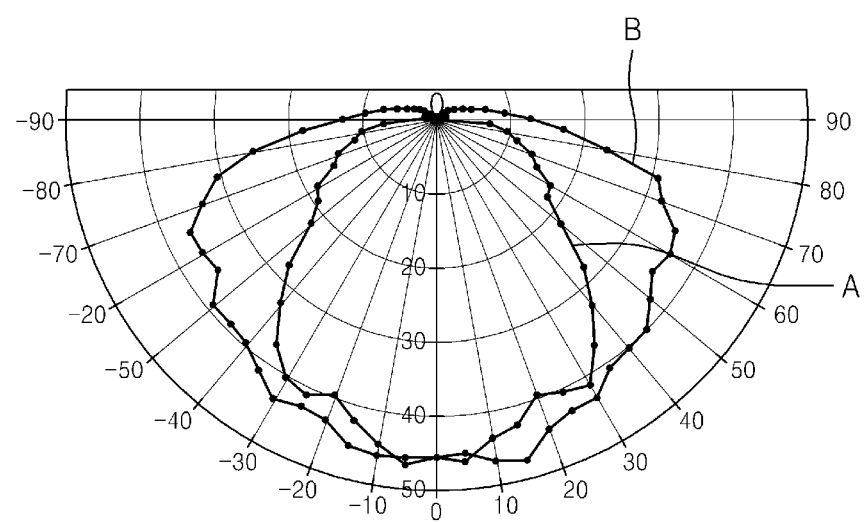
FIG. 21 illustrates an example of light distribution at the L-tube assembly having the structure shown in FIG. 20.

An example of light distribution at the L-tube assembly having the aforementioned structure of FIG. 20 is illustrated in FIG. 21.

Referring to FIG. 21, a curved line A of the light distribution indicates light distribution in a lengthwise direction of the L-tube assembly, and a curved line B of the light distribution indicates light distribution in a vertical direction of the tubular cross-section of the L-tube assembly.

Referring to the curved line B of the light distribution shown in FIG. 21, it is possible to see that the light distribution is further diffused left and right.

Then, a structure of a lighting system including the photo sensor-integrated tubular light emitting apparatus will now be described.

Figure 22:
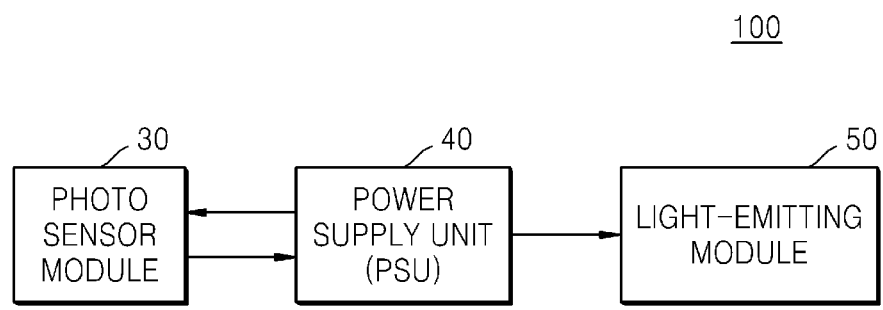
FIG. 22 is a block diagram of a lighting system including the photo sensor-integrated tubular light emitting apparatus, according to an embodiment of the present inventive concept.

FIG. 22 is a block diagram of a lighting system 100 including a photo sensor-integrated tubular light emitting apparatus, according to an embodiment of the present inventive concept.

Referring to FIG. 22, the lighting system 100 may include a photo sensor module 30, a power supply unit (PSU) 40, and a light-emitting module 50.

As an embodiment of the present inventive concept, referring to FIG. 1A or 1B, the photo sensor module 30 and the light-emitting module 50 may be mounted in the photo sensor-integrated tubular light emitting apparatus 10A or 10B, and the PSU 40 may be disposed outside the photo sensor-integrated tubular light emitting apparatus 10A or 10B.

As another embodiment, referring to FIG. 1C, the photo sensor module 30, the PSU 40, and the light-emitting module 50 may be mounted in the photo sensor-integrated tubular light emitting apparatus 10C.

The PSU 40 and the photo sensor module 30 may be electrically connected. In an embodiment, the PSU 40 and the photo sensor module 30 may be connected via a connector. In another embodiment, the PSU 40 and the photo sensor module 30 may exchange a signal via a wireless communication interface. For example, the communication between the PSU 40 and the photo sensor module 30 may be performed via a digital addressable lighting interface (DALI). However, the one or more embodiments of the present inventive concept are not limited thereto, and thus, the communication between the PSU 40 and the photo sensor module 30 may be performed via various wired/wireless communication protocols.

The PSU 40 may include a circuit that converts an alternating current (AC) power into a direct current (DC) power and then provides the DC power to the photo sensor module 30, and a circuit that generates a driving voltage of the light-emitting module 50 based on a signal supplied from the photo sensor module 30.

For example, the photo sensor module 30 may include a sensor that senses an amount of ambient light. For example, the photo sensor module 30 may be embodied by disposing a photo sensor integrated circuit including a photodiode, and various types of peripheral circuits at a PCB. For example, the photo sensor module 30 may include a sensor that senses an amount of ambient light, and a control unit that calculates an ambient illumination level by using signals output from the sensor and that generates a dimmer control signal corresponding to the calculated an ambient illumination level. The dimmer control signal may be a PWM signal or a DC voltage signal. In another embodiment, the photo sensor module 30 may include only the photo sensor integrated circuit, and the control unit may be disposed in the PSU 40.

The PSU 40 and the light-emitting module 50 may be electrically connected. Accordingly, the PSU 40 may generate a driving voltage that corresponds to the signal output from the sensor or that corresponds the dimmer control signal and may apply the driving voltage to the light-emitting module 50. By doing so, intensity of light that is emitted from the light-emitting module 50 may be adaptively adjusted according to an ambient illumination level.

Figure 23:
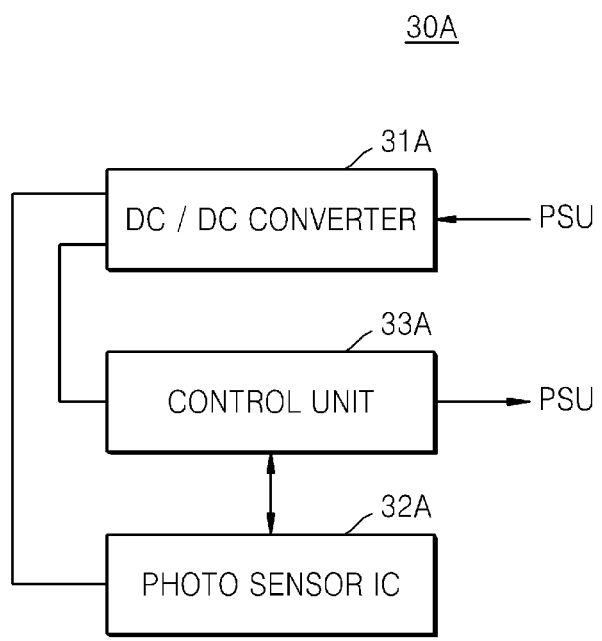
FIG. 23 is a block diagram of a photo sensor module that is an example of the photo sensor module of FIG. 22, according to an embodiment of the present inventive concept.

FIG. 23 is a block diagram of a photo sensor module 30A that is an example of the photo sensor module 30 of FIG. 22, according to an embodiment of the present inventive concept.

As illustrated in FIG. 23, the photo sensor module 30A may include a DC/DC converter 31A, a photo sensor integrated circuit (IC) 32A, and a control unit 33A.

The DC/DC converter 31A may be a circuit that converts a DC power supplied from the PSU 40 into a DC power suitable for the photo sensor module 30A.

In an embodiment, when the photo sensor module 30A uses only one DC power, the DC/DC converter 31A may not be used. In this case, the photo sensor module 30A may be supplied with one desired DC power from the PSU 40. In another embodiment, when a plurality of DC powers are required, the plurality of DC powers may be directly supplied from the PSU 40.

The photo sensor IC 32A may be an IC that includes a sensor for sensing an amount of ambient light of one of the photo sensor-integrated tubular light emitting apparatuses 10A, 10B, and 10C. For example, the photo sensor IC 32A may correspond to an IC formed of a photodiode and a peripheral circuit related to the photodiode.

The photo sensor IC 32A may accumulate photo-charges according to a photo signal at a predetermined time interval, in response to a timing control signal that is applied from the control unit 33A, and generate an electrical signal that corresponds to the accumulated photo-charges.

The control unit 33A may calculate an illumination level by using the electrical signal that is input from the photo sensor IC 32A, and generate a dimmer control signal according to the calculated illumination level. The dimmer control signal that is generated by the control unit 33A may be delivered to the PSU 40.

The dimmer control signal may be a PWM signal or a DC voltage signal. When the calculated illumination level is less than a preset reference illumination level, a duty cycle of the PWM signal may be increased or a voltage level of the DC voltage signal may be increased. On the contrary, when the calculated illumination level is greater than the preset reference illumination level, the duty cycle of the PWM signal may be decreased or the voltage level of the DC voltage signal may be decreased. Here, the increase of the duty cycle of the PWM signal may mean that a (+) pulse width of the PWM signal is increased.

Figure 24:
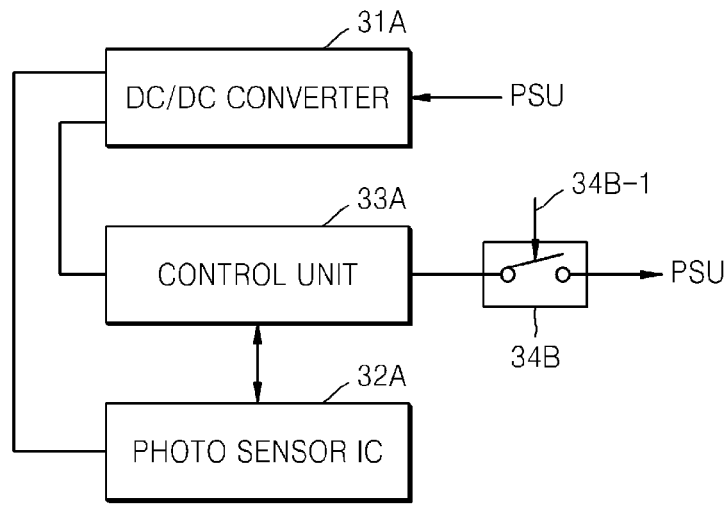
FIG. 24 is a block diagram of a photo sensor module that is another example of the photo sensor module of FIG. 22, according to another embodiment of the present inventive concept.

FIG. 24 is a block diagram of a photo sensor module 30B that is another example of the photo sensor module 30 of FIG. 22, according to another embodiment of the present inventive concept.

As illustrated in FIG. 24, the photo sensor module 30B may include the DC/DC converter 31A, the photo sensor IC 32A, the control unit 33A, and a switch 34B.

Since the DC/DC converter 31A, the photo sensor IC 32A, and the control unit 33A of the photo sensor module 30B shown in FIG. 24 are already described with reference to FIG. 23, detailed descriptions thereof are omitted here.

The photo sensor module 30B of FIG. 24 may further include the switch 34B, compared to the photo sensor module 30A of FIG. 23.

The switch 34B may function to selectively set on or off of an automatic dimmer control function. The switch 34B may receive a dimmer control signal from the control unit 33A, and output or block the dimmer control signal to the PSU 40 in response to selection via a button 34B-1 included in the switch 34B. For example, when the button 34B-1 is in an ON state, the switch 34B may output the dimmer control signal to the PSU 40. On the other hand, when the button 34B-1 is in an OFF state, the switch 34B may not output the dimmer control signal to the PSU 40.

In another embodiment, the switch 34B of the photo sensor module 30B may be disposed at a signal wiring position so as to conduct or block an input or an output of the DC/DC converter 31A. Alternatively, the switch 34B of the photo sensor module 30B may be disposed at a signal wiring position so as to allow or prevent an output signal of the photo sensor IC 32A to be input or from being input to the control unit 33A.

Figure 25:
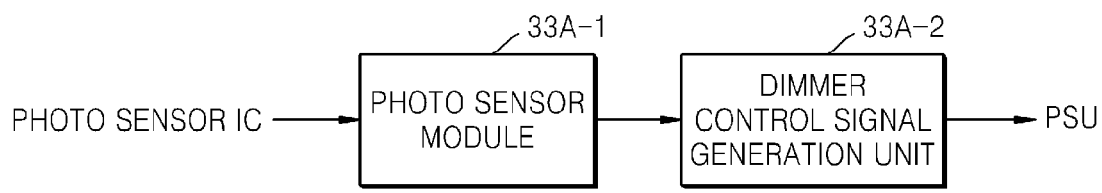
FIG. 25 is a block diagram illustrating in detail a control unit shown in FIGS. 23 and 24.

FIG. 25 is a block diagram illustrating in detail the control unit 33A shown in FIGS. 23 and 24.

As illustrated in FIG. 25, the control unit 33A may include a calculation unit 33A-1 and a dimmer control signal generation unit 33A-2.

The calculation unit 33A-1 may calculate an illumination level by using an electrical signal that is output from the photo sensor IC 32A. For example, the electrical signal output from the photo sensor IC 32A may indicate a voltage that is proportional to an amount of photo-charges that are accumulated in a photodiode during an initial set time period. For example, the calculation unit 33A-1 may calculate the illumination level based on an average value of voltage values that are output from the photo sensor IC 32A in units of the initial set time periods.

The dimmer control signal generation unit 33A-2 may generate a dimmer control signal corresponding to illumination information that is provided from the calculation unit 33A-1. For example, the dimmer control signal may be a PWM signal or a DC voltage signal. When the calculated illumination level is less than a preset reference illumination level, a duty cycle of the PWM signal may be increased or a voltage level of the DC voltage signal may be increased. On the contrary, when the calculated illumination level is greater than the preset reference illumination level, the duty cycle of the PWM signal may be decreased or the voltage level of the DC voltage signal may be decreased. The dimmer control signal that is generated by the dimmer control signal generation unit 33A-2 may be transferred to the PSU 40.

Figure 26:
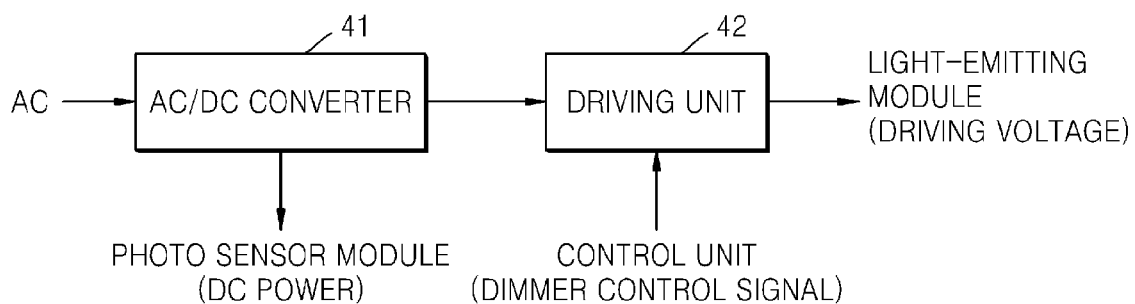
FIG. 26 is a block diagram illustrating in detail a power supply unit (PSU) shown in FIG. 22.

FIG. 26 is a block diagram illustrating in detail the PSU 40 shown in FIG. 22.

As illustrated in FIG. 26, the PSU 40 may include an AC/DC converter 41 and a driving unit 42.

The AC/DC converter 41 may convert an AC power supplied from an external source into a DC power, thereby outputting the DC power to the photo sensor module 30 and the driving unit 42. In an embodiment of the present inventive concept, the DC power that is output to the photo sensor module 30 and the DC power that is output to the driving unit 42 may have the same voltage level. In another embodiment, the DC power that is output to the photo sensor module 30 and the DC power that is output the driving unit 42 may have different voltage levels.

The driving unit 42 may be supplied the DC power from the AC/DC converter 41 and may be also supplied the dimmer control signal from the control unit 33A. The driving unit 42 may generate a driving voltage based on the dimmer control signal. In an embodiment of the present inventive concept, when the dimmer control signal is the PWM signal, the driving unit 42 may generate a driving voltage that is proportional to an average voltage level of the PWM signal. In another embodiment of the present inventive concept, when the dimmer control signal is the DC voltage signal, the driving unit 42 may generate a driving voltage that is proportional to the DC voltage. The driving voltage that is generated by the driving unit 42 may be transferred to the light-emitting module 50.

Figure 27:
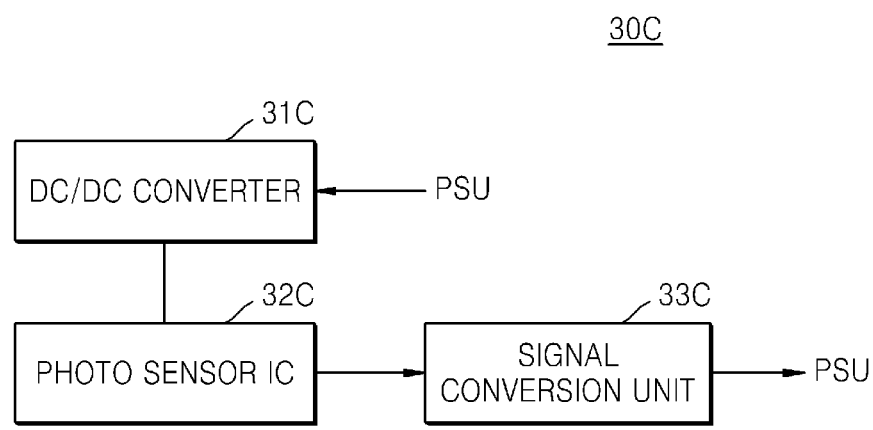
FIG. 27 is a block diagram of a photo sensor module that is another example of the photo sensor module of FIG. 22, according to another embodiment of the present inventive concept.

FIG. 27 is a block diagram of a photo sensor module 30C that is another example of the photo sensor module 30 of FIG. 22, according to another embodiment of the present inventive concept.

As illustrated in FIG. 27, the photo sensor module 30C may include a DC/DC converter 31C, a photo sensor IC 32C, and a signal conversion unit 33C.

The DC/DC converter 31C may be a circuit that converts a DC power supplied from the PSU 40 into a DC power suitable for the photo sensor module 30C.

In an embodiment of the present inventive concept, when the photo sensor module 30C uses only one DC power, the DC/DC converter 31C may not be used. In this case, the photo sensor module 30C may be supplied one desired DC power from the PSU 40. In another embodiment, when a plurality of DC powers are required, the plurality of DC powers may be directly supplied from the PSU 40.

The photo sensor IC 32C may be an IC that includes a sensor for sensing an amount of ambient light of one of the photo sensor-integrated tubular light emitting apparatuses 10A, 10B, and 10C (see FIGS. 1A-1C). For example, the photo sensor IC 32C may correspond to an IC formed of a photodiode and a peripheral circuit related to the photodiode.

The photo sensor IC 32C may accumulate photo-charges according to a photo signal at a predetermined time interval, and generate an electrical signal that corresponds to the accumulated photo-charges.

The signal conversion unit 33C may convert the electrical signal that is input from the photo sensor IC 32C into a dimmer control signal. For example, the signal conversion unit 33C may generate the dimmer control signal having a voltage level that is in inverse proportion to a voltage level of the electrical signal that is input from the photo sensor IC 32C. The dimmer control signal that is generated by the signal conversion unit 33C may be transferred to the PSU 40.

Figure 28:
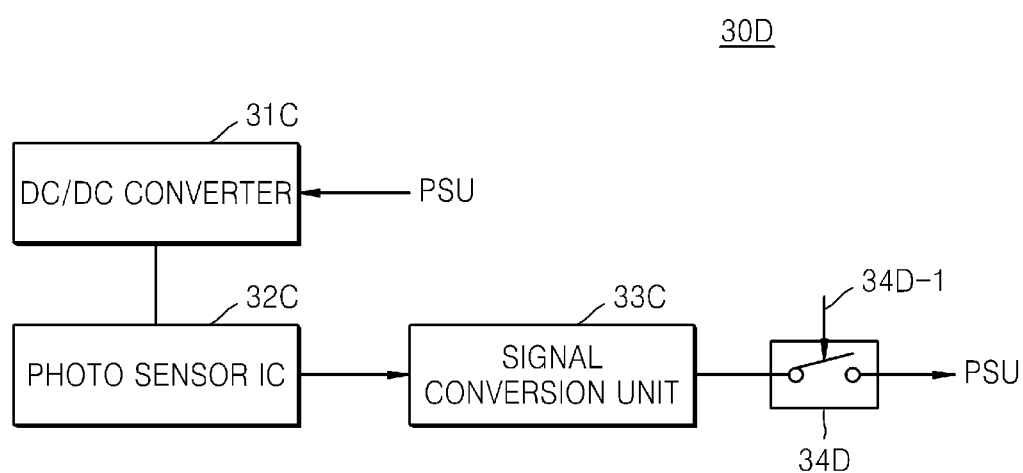
FIG. 28 is a block diagram of a photo sensor module that is another example of the photo sensor module of FIG. 22, according to another embodiment of the present inventive concept.

FIG. 28 is a block diagram of a photo sensor module 30D that is another example of the photo sensor module 30 of FIG. 22, according to another embodiment of the present inventive concept.

As illustrated in FIG. 28, the photo sensor module 30D may include the DC/DC converter 31C, the photo sensor IC 32C, the signal conversion unit 33C, and a switch 34D.

Since the DC/DC converter 31C, the photo sensor IC 32C, and the control unit 33C of the photo sensor module 30C shown in FIG. 28 are already described with reference to FIG. 27, detailed descriptions thereof are omitted here.

The photo sensor module 30D of FIG. 28 may further include the switch 34D, compared to the photo sensor module 30C of FIG. 27.

The switch 34D may function to selectively set on or off of an automatic dimmer control function. The switch 34D may receive a dimmer control signal from the signal conversion unit 33C, and output or block the dimmer control signal to the PSU 40 in response to selection via a button 34D-1 included in the switch 34D. For example, when the button 34D-1 is in an ON state, the switch 34D may output the dimmer control signal to the PSU 40. On the other hand, when the button 34D-1 is in an OFF state, the switch 34D may not output the dimmer control signal to the PSU 40.

In another embodiment, the switch 34D of the photo sensor module 30D may be disposed at a signal wiring position so as to conduct or block an input or an output of the DC/DC converter 31C. Alternatively, the switch 34D of the photo sensor module 30D may be disposed at a signal wiring position so as to allow or prevent an output signal of the photo sensor IC 32C to be input or from being input to the signal conversion unit 33C.

Figure 29:
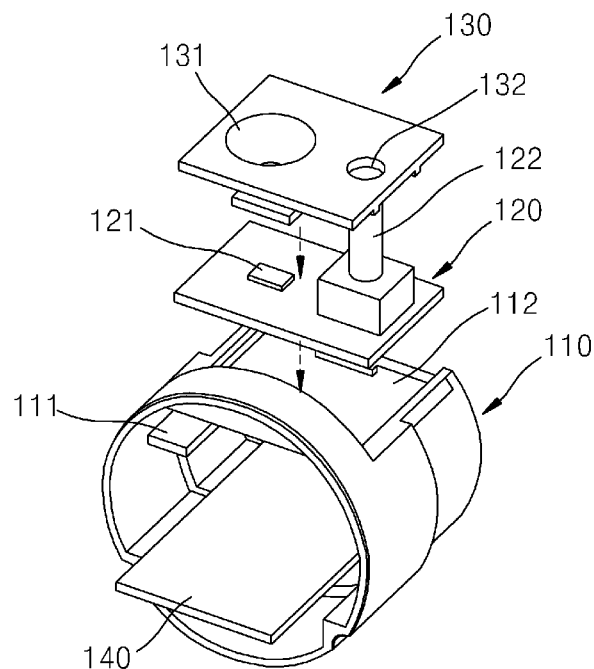
FIG. 29 is an exploded perspective view illustrating a light receiving structure of one of the sockets including a mounted photo sensor module shown in FIGS. 1A, 1B, or 1C.

FIG. 29 is an exploded perspective view illustrating a light receiving structure of one of the sockets 15A, 14B, and 15C including a mounted photo sensor module shown in FIGS. 1A, 1B, and 1C.

Referring to FIG. 29, the socket 15A, 14B, and 15C including the mounted photo sensor module may include a cap 110, a PCB 120 of the photo sensor module, and a top cover 130.

Here, reference numeral 140 of FIG. 29 corresponds to the light-emitting module 50 shown in FIG. 22.

A supporting unit 111 having a projected form may be formed at inner side surfaces of the cap 110. The PCB 120 may be fixed to the supporting unit 111. Then, a hole 112 may be formed in a partial region of the cap 110. The PCB 120 may be inserted into the cap 110 via the hole 112.

In an embodiment of the present inventive concept, a photo sensor IC 121 that configures a photo sensor module (refer to the photo sensor module 30 of FIG. 22), a button 122 of a switch, and various peripheral circuits may be disposed on the PCB 120. In another embodiment of the present inventive concept, the button 122 of the switch may be omitted from the PCB 120. The button 122 of the switch may function to selectively set on or off an automatic dimmer control function. For example, the button 122 of the switch may correspond to the button 34B-1 of the switch 34B shown in FIG. 24 or the button 34D-1 of the switch 34D shown in FIG. 28.

The photo sensor module 30 disposed on the PCB 120 may be formed as one of circuits shown in FIGS. 23 through 25 or FIGS. 27 and 28. In another embodiment of the present inventive concept, the PCB 120 may be designed to selectively include the photo sensor IC 32A or 32C and some of circuit configuring elements of the circuits that are shown in FIGS. 23 through 25 or FIGS. 27 and 28.

The top cover 130 may be combined with the PCB 120 or the cap 110 and may have a through window 131 that guides external light of the cap 110 to be received by the photo sensor IC 121 included in the PCB 120. Also, the top cover 130 may have a through hole 132 to allow the button 122 of the switch, which is mounted on the PCB 120, to be externally projected from the cap 110.

Figure 30:
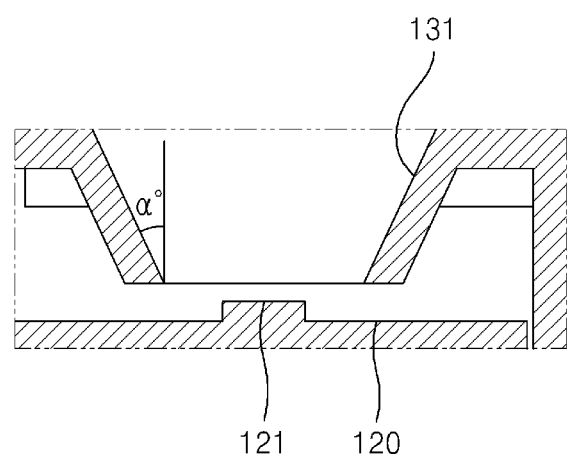
FIG. 30 is a diagram illustrating a cross-section of a through window shown in FIG. 29.

For example, the through window 131 formed at the top cover 130 may have a structure as shown in FIG. 30.

FIG. 30 is a diagram illustrating a cross-section of the through window 131 shown in FIG. 29.

Referring to FIG. 30, a diameter of an input portion of the through window 131 to which the external light of the cap 110 is incident may be greater than a diameter of an output portion of the through window 131 from which the external light is output. A slope a that represents a ratio of an inner diameter to an outer diameter of the through window 131 may be determined during a design procedure, in consideration of a reference illumination level.

Figure 31:
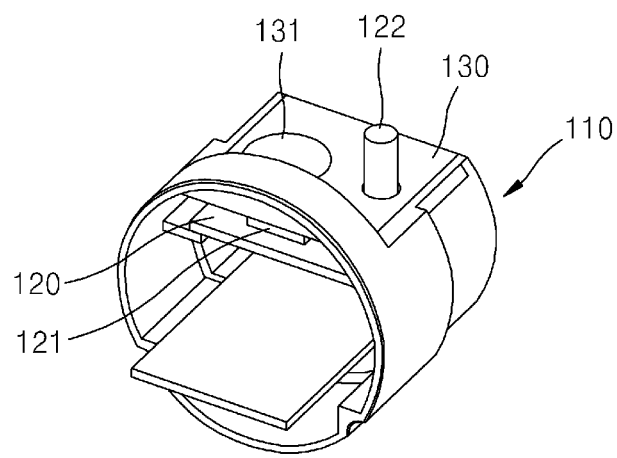
FIG. 31 illustrates an assembly of a socket including a mounted photo sensor module shown in FIGS. 1A, 1B, or 1C, according to an embodiment of the present inventive concept.

FIG. 31 illustrates an assembly of a socket including a mounted photo sensor module shown in FIGS. 1A, 1B, and 1C, according to an embodiment of the present inventive concept. In more detail, FIG. 31 is an exploded perspective view illustrating the socket shown in FIG. 29 including a mounted photo sensor module.

Referring to FIG. 31, the button 122 of the switch that is mounted on the PCB 120 may be projected via the through hole 132 of the top cover 130 that is combined with the cap 110. Then, external light may be incident on the photo sensor IC 121 disposed on the PCB 120 via the through window 131 that is formed in the top cover 130. Accordingly, the photo sensor IC 121 may sense an amount of ambient light outside the cap 110.

Figure 32:
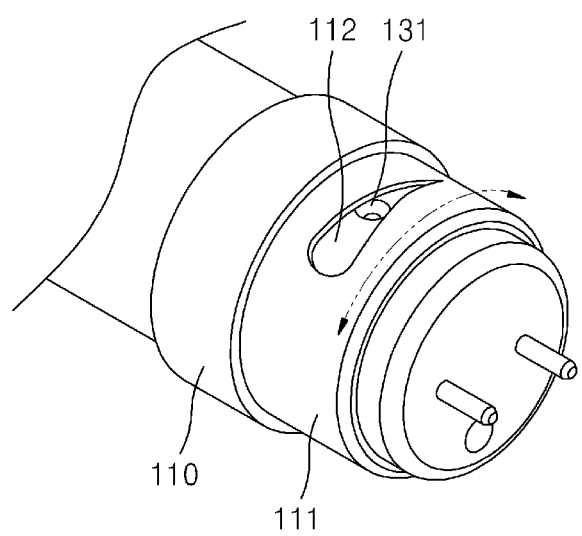
FIG. 32 is a perspective view illustrating a socket including a mounted photo sensor module shown in FIGS. 1A, 1B, and 1C, according to another embodiment of the present inventive concept.

FIG. 32 is a perspective view illustrating a socket including a mounted photo sensor module shown in FIGS. 1A, 1B, and 1C, according to another embodiment of the present inventive concept.

Referring to FIG. 32, the socket including the mounted photo sensor module may include a cylindrical member for light-reception adjustment 111 that surrounds a cap 110. A through hole 112 may be formed in a partial region of the cylindrical member for light-reception adjustment 111. Also, as described with reference to FIG. 29, the through window 131 may be formed at the cylindrical member for light-reception adjustment 111. Accordingly, when the cylindrical member for light-reception adjustment 111 is rotated in an arrow direction, it is possible to adjust an amount of light that passes through the through window 131 of the cylindrical member for light-reception adjustment 111 and that is incident on the photo sensor IC 121 disposed on the PCB 120 that is fixed to the cap 110.

For example, when light that passes through the through window 131 is completely blocked by rotating the cylindrical member for light-reception adjustment 111, an automatic dimmer control function may become inactive.

Also, when an amount of light that is incident on the photo sensor IC 121 is changed by using the cylindrical member for light-reception adjustment 111, a reference illumination level applied to an automatic dimmer control may be changed. Thus, a user may change a target illumination level by using the cylindrical member for light-reception adjustment 111.

Figure 33A:
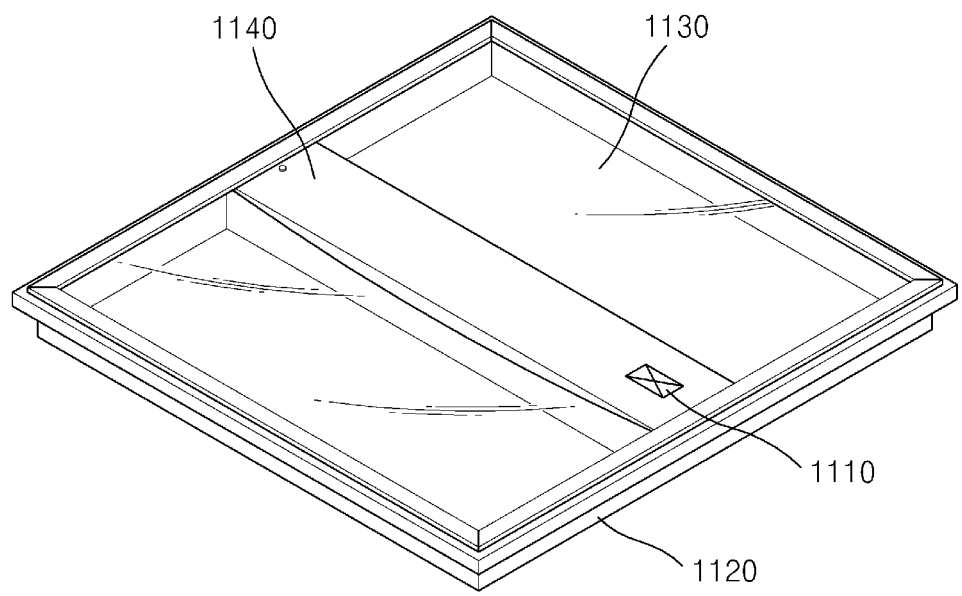
FIGS. 33A through 33C illustrate various types of a lighting apparatus to which one or more embodiments may be applied.
Figure 33B:
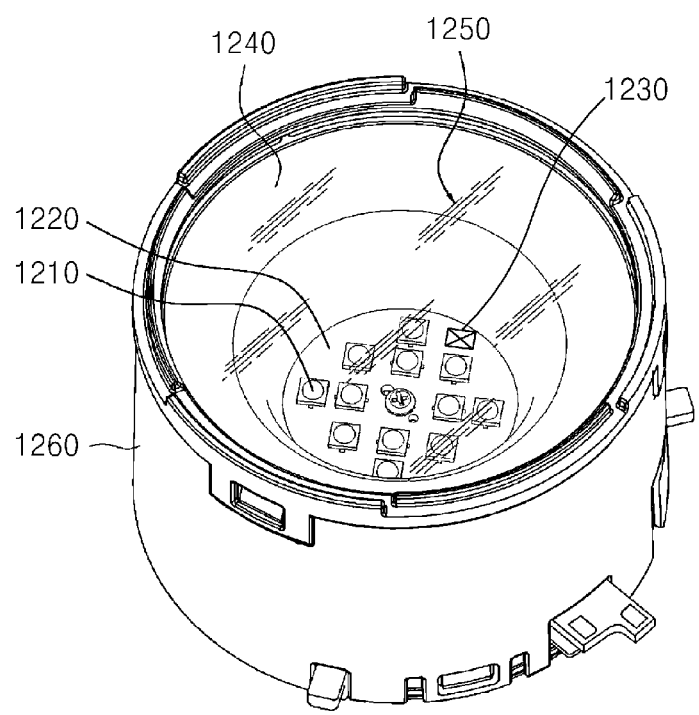
Figure 33C:
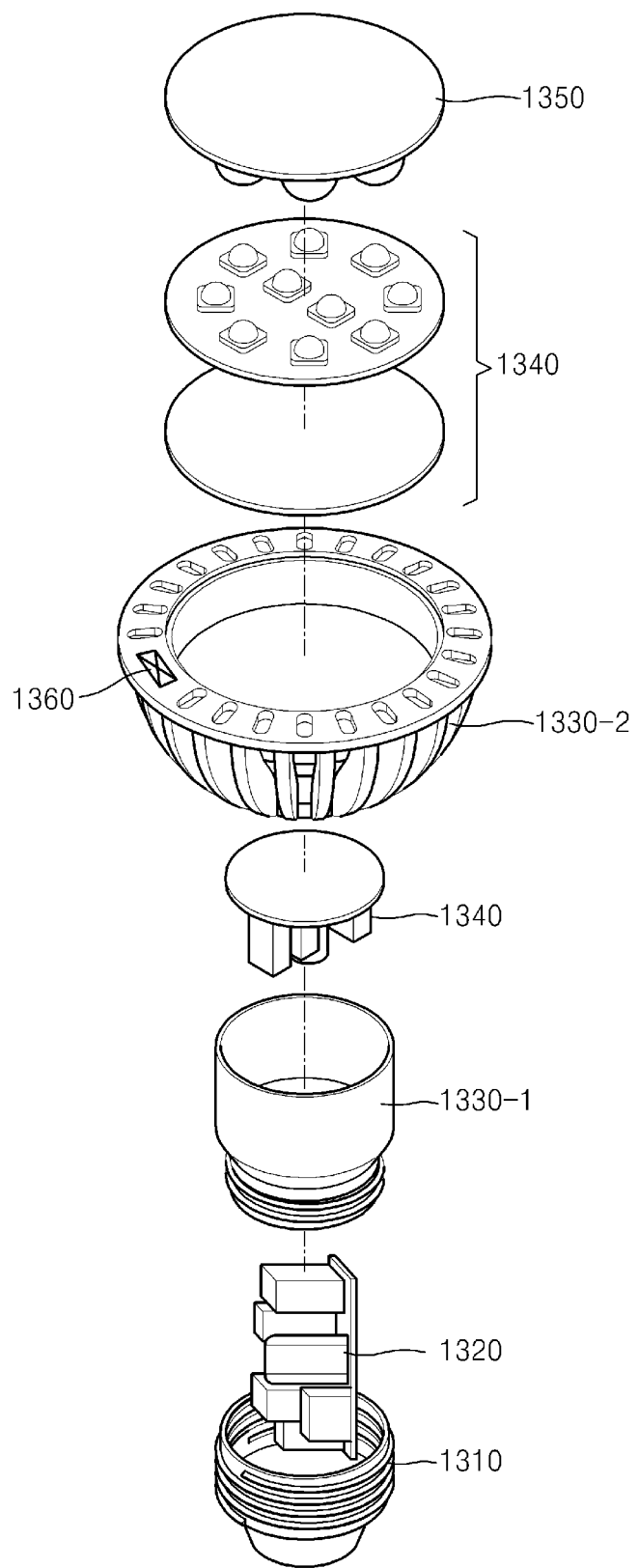

FIGS. 33A through 33C illustrate various types of a lighting apparatus to which the one or more embodiments may be applied.

FIG. 33A illustrates a plate-form lighting apparatus.

Referring to FIG. 33A, the plate-form lighting apparatus may include a photo sensor module 1110, a housing 1120, a diffusion cover 1130, and a power cover 1140. In addition, although not illustrated, the housing 1120, the diffusion cover 1130, and the power cover 1140 may include a PSU and a light-emitting module. Since the photo sensor module 1110 is already described in detail, detailed descriptions thereof are omitted here.

FIG. 33B illustrates a cylindrical-form lighting apparatus.

Referring to FIG. 33B, the cylindrical-form lighting apparatus may include a light-emitting device 1210, a circuit board 1220, a photo sensor module 1230, a reflective surface 1240, a diffusion plate 1250, and a body 1260. Since the photo sensor module 1230 is already described in detail, detailed descriptions thereof are omitted here.

FIG. 33C is an exploded view illustrating a lamp-form lighting apparatus.

Referring to FIG. 33C, the lamp-form lighting apparatus may include a socket 1310, a power unit 1320, heat dissipation units 1330-1 and 1330-2, an LED power source 1340, an optical portion 1350, and a photo sensor module 1360. Since the photo sensor module 1360 is already described in detail, detailed descriptions thereof are omitted here.

In order to control LED lighting with a user-friendly function, it may be necessary to develop a control technology according to an analysis with respect to psychological and biological influences on a person due to a white and/or mixed color LED light source, and also, it is possible to design an apparatus by analyzing an effect of the apparatus on a person due to spatial arrangement, array, and form.

In consideration of an influence on a human biorhythm, a psychological status, academic achievement, a work ability, or the like due to ambient illumination, it is possible to design a digital lighting control such as a wireless (remote) control or artificial intelligence sensing on color, temperature, brightness, or the like of illumination, by using a portable device such as a smartphone.

For example, for a math class, blue illumination having a correlated color temperature (CCT) of 7600 through 8000 Kelvin(K) may be highly effective, for a language class, general illumination having a CCT of 4200 through 4600K may be highly effective, and for art and music classes, red illumination having a CCT of 2200 through 2600K may be highly effective. By providing optimized color illumination based on an influence of brightness and color temperature of illumination with respect to brain waves and psychological statuses, it is possible to provide a customized lighting apparatus so as to improve study and work efficiency.

Also, by adding a communication function to LED lighting apparatuses and display devices, it is possible to achieve a visible-light wireless communication technology to simultaneously use LED lighting apparatuses for both their intended purpose as an LED light source and an additional purpose as a communication means. This is because the LED light source is advantageous in that the LED light source has a long lifetime and excellent electric power efficiency, realizes various colors, has a fast switching speed for digital communication, and may be digitally controlled.

Figure 34A:
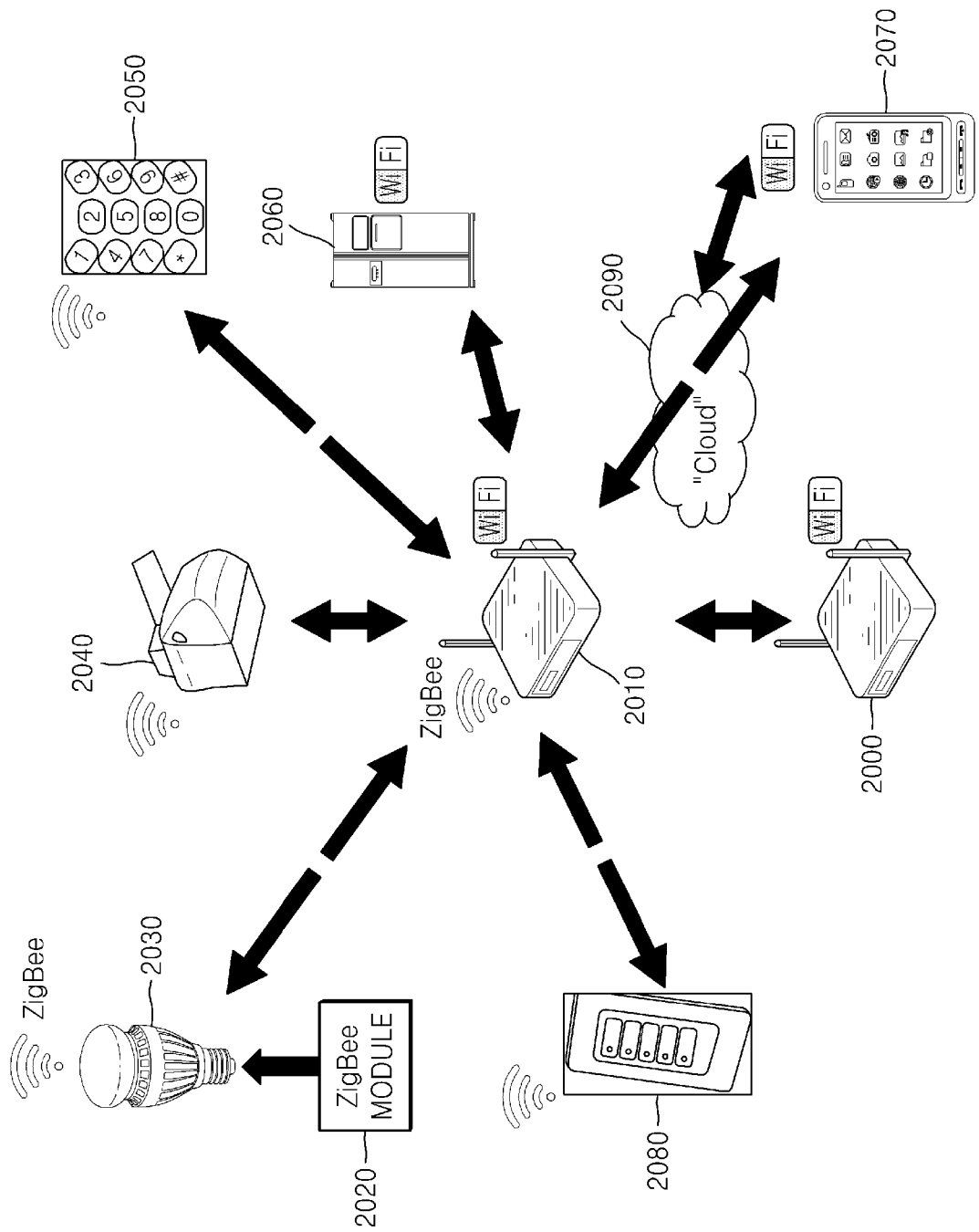
FIGS. 34A and 34B illustrate a home network to which a lighting system using a photo sensor-integrated tubular light emitting apparatus is applied, according to an embodiment of the present inventive concept.
Figure 34B:
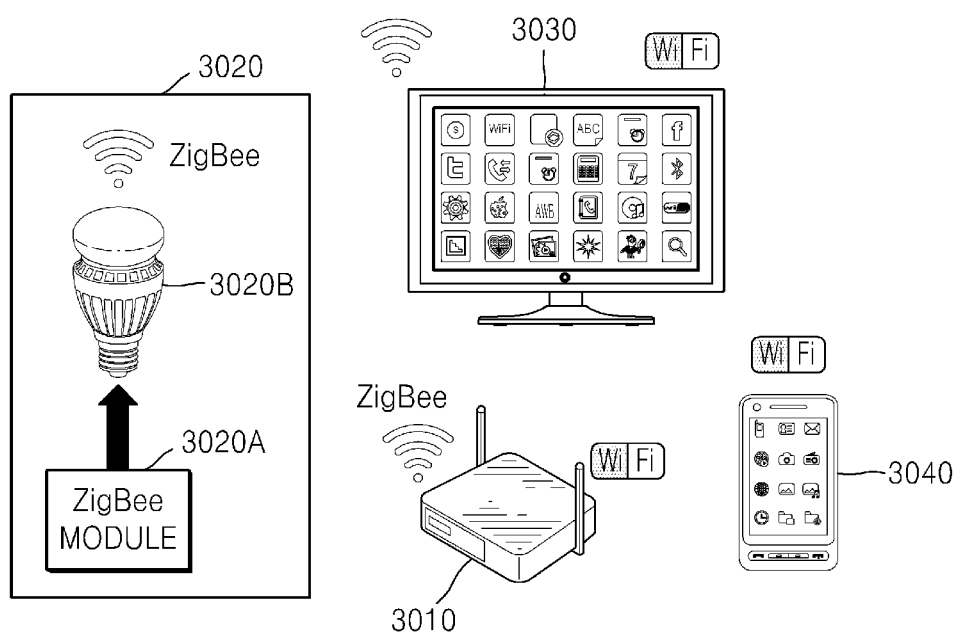

FIGS. 34A and 34B illustrate a home network to which a lighting system using a photo sensor-integrated tubular light emitting apparatus is applied, according to an embodiment of the present inventive concept.

As illustrated in FIG. 34A, the home network may include a home wireless router 2000, a gateway hub 2010, a ZigBee module 2020, a photo sensor-integrated LED lamp 2030, a garage door lock 2040, a wireless door lock 2050, home application 2060, a cell phone 2070, a wall-mounted switch 2080, and a cloud network 2090.

According to operating statuses of a bedroom, a living room, an entrance, a garage, electric home appliances, or the like and ambient environments/situations, illumination brightness of the photo sensor-integrated LED lamp 2030 may be automatically adjusted by using in-house wireless communication such as ZigBee, Wi-Fi, or the like.

For example, as illustrated in FIG. 34B, according to a type of a program broadcasted on a TV 3030 or mobile device 3040 or brightness of a screen of the TV 3030 or mobile device 3040, illumination brightness of a photo sensor-integrated LED 3020B may be automatically adjusted by using a gateway 3010 and a ZigBee module 3020A in a ZigBee system 3020. In an embodiment, when a cozy atmosphere is required due to broadcasting of human drama, illumination may be adjusted to have a color temperature equal to or less than 12000K according to the cozy atmosphere. In another embodiment, when a light atmosphere is required due to broadcasting of a comedy program, illumination may be adjusted to have a color temperature equal to or greater than 12000K and may have a blue-based white color.

The ZigBee module 2020 or 3020A may be integrally modularized with a photo sensor, and may be integrally formed with a light emitting apparatus.

The visible-light wireless communication technology may involve wirelessly delivering information by using light having a visible wavelength band that is visible to human eyes. The visible-light wireless communication technology may be different from a conventional wired optical communication technology and conventional infrared wireless communication in that the visible-light wireless communication technology uses light having a visible wavelength band, and may be different from the conventional wired optical communication technology in that the visible-light wireless communication technology uses a wireless environment. Also, the visible-light wireless communication technology may have excellent convenience and physical security in that the visible-light wireless communication technology is not regulated or controlled in terms of a frequency usage, unlike conventional radio frequency (RF) wireless communication, is unique since a user may check a communication link, and most of all, the visible-light wireless communication technology may have a characteristic of a convergence technology by simultaneously allowing for an light source to be used for its original purpose and an additional purpose of a communication function.

Also, the LED illumination may be used as inner or outer light sources for vehicles. For the inner light sources, the LED illumination may be used as an inner light, a reading light, a gauge board, or the like for vehicles, and for the outer light sources, the LED illumination may be used as a headlight, a brake light, a direction guide light, a fog light, a daytime running light, or the like for vehicles.

An LED using a particular wavelength may promote a growth of plants, may stabilize human feelings, or may cure a disease. The LED may be applied to a light source that is used in robots or various mechanical equipment. In addition to the LED having low power consumption and a long lifetime, it is possible to embody illumination of the present inventive concept in combination with a eco-friendly renewable energy power system such as a solar cell, a wind power, or the like.

While the present inventive concept has been particularly shown and described with reference to exemplary embodiments thereof, it will be understood that various changes in form and details may be made therein without departing from the spirit and scope of the following claims.

What is claimed is:

1. A photo sensor-integrated tubular light emitting apparatus, comprising:
   a cylindrical cover unit comprising a heat dissipation member and a cover, the cover having light-transmittance and being combined with the heat dissipation member;
   a light-emitting module disposed in the cylindrical cover unit and having a plurality of arrayed light-emitting devices therein; and
   a pair of sockets combined with ends of the cylindrical cover unit,
   wherein:
   a photo sensor module is disposed in one of the pair of sockets,
   a driving voltage applied to the light-emitting module is adjusted based on an amount of light sensed by the photo sensor module, and
   the one of the pair of sockets in which the photo sensor module is disposed comprises:
   a cap having a supporting unit to which a printed circuit board (PCB) of the photo sensor module is fixed; and
   a top cover combined with the cap or the PCB and having a through window to guide external light to be received by the photo sensor module.

2. The photo sensor-integrated tubular light emitting apparatus of claim 1, wherein:
   an electrode terminal is disposed at one of the pair of sockets,
   a dummy terminal is disposed at the other of the pair of sockets, and
   the electrode terminal is electrically connected with the light-emitting module.

3. The photo sensor-integrated tubular light emitting apparatus of claim 1, wherein the cover has an opening extending lengthwise at a side of the cover in a longitudinal direction.

4. The photo sensor-integrated tubular light emitting apparatus of claim 1, wherein a diameter of an input portion of the through window to which the external light is incident is greater than a diameter of an output portion of the through window from which the external light is output.

5. The photo sensor-integrated tubular light emitting apparatus of claim 1, wherein:
   a switch configured to selectively set on or off an automatic dimmer control is additionally disposed on the PCB, and
   a through hole is defined in the top cover to allow a button of the switch to be externally projected from the cap.

6. The photo sensor-integrated tubular light emitting apparatus of claim 1, further comprising a cylindrical member surrounding the cap for light-reception adjustment,
   wherein a through hole is defined in a partial region of the cylindrical member such that an amount of light passing through the through hole is adjusted according to rotation of the cylindrical member.

7. The photo sensor-integrated tubular light emitting apparatus of claim 1, wherein the photo sensor module comprises a photo sensor integrated circuit (IC) configured to convert an incident optical signal into an electrical signal.

8. The photo sensor-integrated tubular light emitting apparatus of claim 7, wherein the photo sensor module further comprises a circuit configured to generate a dimmer control signal that corresponds to the electrical signal converted by the photo sensor IC.

9. The photo sensor-integrated tubular light emitting apparatus of claim 1, wherein:
   a power supply unit (PSU) configured to generate a direct current (DC) power and the driving voltage is disposed in the other one of the pair of sockets, where the photo sensor module is not disposed, and
   the PSU and the photo sensor module are electrically connected.

10. The photo sensor-integrated tubular light emitting apparatus of claim 3, further comprising:
    a loading unit onto which the PCB is disposed,
    wherein the opening of the cover is smaller than the loading unit such that a cover end that defines the opening of the cover interferes with the PCB disposed onto the loading unit.

11. A lighting system, comprising:
    a tubular light emitting apparatus comprising a cylindrical cover and a pair of sockets, wherein a light-emitting module is disposed in the cylindrical cover, and the pair of sockets are combined with ends of the cylindrical cover, and a photo sensor module is disposed in one of the pair of sockets;
    a power supply unit (PSU) configured to convert an alternating current (AC) power into a direct current (DC) power, provide the DC power to the photo sensor module, and generate a driving voltage based on a signal supplied from the photo sensor module; and
    a wiring structure configured to transfer the driving voltage to the light-emitting module via the one of the pair of sockets,
    wherein the photo sensor module comprises a photo sensor integrated circuit (IC) configured to convert an incident optical signal into an electrical signal, and
    the one of the pair of sockets in which the photo sensor module is disposed comprises:
    a cap having a supporting unit to which a printed circuit board (PCB) of the photo sensor module is fixed; and
    a top cover combined with the cap or the PCB and having a through window to guide external light to be received by the photo sensor module.

12. The lighting system of claim 11, wherein:
    an electrode terminal is disposed at the one of the pair of sockets,
    a dummy terminal is disposed at the other of the pair of sockets,
    the electrode terminal is electrically connected with the light-emitting module, and
    the light-emitting module is disposed in the other of the pair of sockets at which the dummy terminal is disposed.

13. The lighting system of claim 11, further comprising a connector electrically connecting the PSU and the light-emitting module,
    wherein the DC power and the signal supplied from the photo sensor module are transferred via the connector.

14. The lighting system of claim 11, wherein:
    a switch configured to selectively set on or off an automatic dimmer control function is additionally disposed on the PCB, and a through hole is defined in the top cover to allow a button of the switch to be externally projected from the cap.

15. The lighting system of claim 14, further comprising a cylindrical member surrounding the cap for light-reception adjustment,
wherein a through hole is defined in a partial region of the cylindrical member such that an amount of light passing through the through hole is adjusted according to rotation of the cylindrical member.

16. The lighting system of claim 11, wherein the cylindrical cover has an opening extending lengthwise at a side of the cover in a longitudinal direction.

17. The lighting system of claim 16, further comprising:
a loading unit onto which the PCB is disposed,
wherein the opening of the cylindrical cover is smaller than the loading unit such that a cover end that defines the opening of the cylindrical cover interferes with the PCB disposed onto the loading unit.

* * * * *